United States Patent [19]

Nagashima et al.

[11] Patent Number: 5,707,458
[45] Date of Patent: Jan. 13, 1998

[54] LIGHT CONVERGING SOLAR MODULE

[75] Inventors: Tomonori Nagashima, Susono; Kyoichi Tange, Mishima; Kouetsu Hibino, Susono, all of Japan

[73] Assignee: Toyota Jidosha Kabushiki Kaisha, Japan

[21] Appl. No.: 652,155

[22] Filed: May 23, 1996

[30] Foreign Application Priority Data

| | | | |
|---|---|---|---|
| May 26, 1995 | [JP] | Japan | 7-127733 |
| Nov. 22, 1995 | [JP] | Japan | 7-304539 |
| Jan. 19, 1996 | [JP] | Japan | 8-007274 |

[51] Int. Cl.$^6$ ................................. H01L 31/052
[52] U.S. Cl. .................. 136/246; 126/573; 126/581; 126/600; 136/259; 250/203.4; 353/3
[58] Field of Search .................. 136/246, 259; 250/203.4; 353/3; 126/573, 576, 581, 600, 605

[56] References Cited

U.S. PATENT DOCUMENTS

| | | | |
|---|---|---|---|
| 4,041,307 | 8/1977 | Napoli et al. | 250/203.4 |
| 4,147,561 | 4/1979 | Knight | 136/206 |
| 4,304,955 | 12/1981 | Meckler | 136/259 |

FOREIGN PATENT DOCUMENTS

| | | | |
|---|---|---|---|
| 59-58959 | 4/1984 | Japan | 136/246 |
| 61-164272 | 7/1986 | Japan | 136/246 |
| 62-5315 | 1/1987 | Japan | 136/246 |
| 2-42453 | 3/1990 | Japan | 136/246 |
| 4-49685 | 11/1992 | Japan | 136/246 |

OTHER PUBLICATIONS

"Solar Power Generation," Takahashi et al., 1980, pp. 360–361, 568, including one-page abstract.
"Solar Cells and Their Applications" edited by Partain.
"Silicon and Gallium Arsenide Point–Focus Terrestrial Concentrator Modules", Goodman, Jr. et al., pp. 247–263.
"Concentrator Modules Using Multijunction Cells", Fraas, pp. 301–322.

*Primary Examiner*—Aaron Weisstuch
*Attorney, Agent, or Firm*—Finnegan, Henderson, Farabow, Garrett & Dunner, L.L.P.

[57] ABSTRACT

In order to generate sufficient electricity in a small light converging solar module, a power generation solar cell is provided with four movement solar cells, situated around it. Below the respective movement solar cells, electromagnets are situated, connected to corresponding movement solar cells. The power generation solar cell, the movement solar cells, and the electromagnets are all mounted on a cell holder, around which a permanent magnet in the form of a ring is provided. When a converged spot moves its position from on the power generation solar cell to a position off the power generation solar cell, and onto one of the movement solar cells, electricity is supplied to the corresponding electromagnet, thereby moving the cell holder due to attracting forces generated between the electromagnet and the permanent magnet. After the cell holder is moved to such a point where the converged spot correctly falls on the power generation solar cell, the cell holder stops its movement.

12 Claims, 16 Drawing Sheets

LIGHT CONVERGING SOLAR MODULE

BACKGROUND OF THE INVENTION

1. Field of the Invention

The present invention relates to an improvement to a converging solar module which tracks sunlight for achieving effective generation of electricity.

2. Description of the Prior Art

Solar batteries have been utilized for various purposes, including the generation of relatively high power electricity. In constituting such a large-power generating system utilizing solar batteries, since the solar batteries are required to generate an increased amount of electricity, it is necessary to increase the amount of light incident the solar cells. As a means for increasing the amount of incoming light, a light converging solar module has been proposed. With this module, since sunlight is converged through a lens, an increased amount of light is introduced. As a result, the active area of expensive solar batteries can be reduced, as well as reducing the costs of the module.

More particularly, in a converging solar module, sunlight is converged so as to be 10 to 1000 times more intense than before irradiating the solar cells. Thus, only an area of the solar cells that is reduced to 1/10 to 1/1000 in size is needed to receive the same amount of sunlight, which contributes to a considerable reduction of costs. In this case, however, such an module requires a larger converging lens, not to mention a larger pedestal for holding the lens.

Provided that the sun always stays at the same position, as shown in FIG. 20, the sunlight 10 is converged through a converging lens 11 to form a converged spot at the focal point of the lens 11 or the vicinity thereof, that is, a small area including the focal point. Thus, with a solar cell 3 placed where the converged spot 13 is formed, effective electricity generation can be performed.

In reality, however, as the sun moves over a period of time, the incoming direction of the sunlight 10 relative to the converging lens 11 varies with time. This may cause the converged spot 13 to be formed off the solar cell 3 with some incident angles, as shown in FIG. 21, resulting in a considerably reduced amount of electricity generated by the solar cell Therefore, in order to secure a sufficient amount of sunlight irradiating the solar cell 3, it is necessary for the converging lens 11 and the solar cell 3 to always be facing in the direction from which the sunlight is coming.

Japanese Utility Model Laid-Open Publication No. Sho 62-5315 discloses such a Solar module, in which, as shown in FIG. 22, the converging lens 11 and the solar cell 3 are controlled so as to always face the sun by means of an unillustrated tracking mechanism, so that the converging spot 13 always falls within the solar cell 3, in order to achieve favorable generation of electricity.

In the module of FIG. 22, however, since it is necessary to move both the converging lens 11 and the solar cell 3, and thus the pedestal holding them, a large mechanism is required to move such large components, which inevitably has an adverse effect on the cost. Moreover, since such a large tracking mechanism is driven with a large force, the generated electricity is partly consumed for driving the mechanism, which resultantly deteriorates the generation efficiency of the whole system.

SUMMARY OF THE INVENTION

The present invention is conceived to overcome the above mentioned problems, and thus aims to provide a converging solar module which is small and light and which can detect the position of a converged spot with high accuracy, while considerably reducing costs and the energy required for driving during tracking.

According to a first aspect of the invention, there is provided a converging solar module comprising: a converging lens fixedly situated, for converging sunlight; a solar cell movably situated according to the position of a converged spot formed at or close to, a focal point of the converging lens; position detection means for detecting the position of the converged spot; and cell moving means for moving the solar cell to the position of the converged spot, which has been detected by the position detection means.

According to a second aspect of the invention, there is provided a converging solar module according to the first aspect of the invention, wherein the position detection means is a light position detection sensor.

According to a third aspect of the invention, there is provided a converging solar module according to the first aspect of the invention, wherein the position detection means is a solar cell.

According to a fourth aspect of the invention, there is provided a converging solar module according to the third aspect of the invention, wherein the solar cell constituting the position detection means includes at least three movement solar cells situated around a power generation solar cell, the three movement solar cells generating electricity to be used for driving the cell moving means, and thereby moving the power generation and movement solar cells.

According to a fifth aspect of the invention, there is provided a converging solar module according to the third aspect of the invention, wherein the power generation solar cell is divided into at least three sub-cells.

According to a sixth aspect of the invention, there is provided a converging solar module according to the fifth aspect of the invention, wherein the sub-cells of the power generation solar battery transmit outputs, each of which is respectively detected and compared with one another, to thereby determine the position of the converged spot.

According to a seventh aspect of the invention, there is provided a converging solar module according to the first aspect of the invention, wherein the cell moving means utilizes magnetic force.

According to an eighth aspect of the invention, there is provided a converging solar module according to the first aspect of the invention, wherein the cell moving means is a motor.

According to a ninth aspect of the invention, there is provided a converging solar module according to the first aspect of the invention, wherein a plurality of converging lenses and solar cells are respectively situated.

According to a tenth aspect of the invention, there is provided a converging solar module according to the seventh aspect of the invention, wherein the cell moving means includes: a pedestal; a cell holder situated on the pedestal and provided with the solar cell; a permanent magnet situated around the pedestal, surrounding the solar cell; and an electromagnet mounted on the cell holder, with one end directing the permanent magnet; and the solar cell includes: a power generation solar cell; and at least three movement solar cells, the movement solar battery being situated around the generating solar cell with a substantially equal space between adjoining ones and connected to the electromagnet, the one end of the electromagnet directing the permanent magnet and a directed portion of the permanent magnet having opposite polarity to each other.

According to an eleventh aspect of the invention, there is provided a converging solar module according to the seventh aspect of the invention, wherein the cell moving means includes: a pedestal; a cell holder situated on the pedestal and provided with the solar cell; a permanent magnet situated around the pedestal, surrounding the solar cell; and an electromagnet mounted on the cell holder, with one end directing the permanent magnet; the one end of the electromagnet directing the permanent magnet and a directed portion of the permanent magnet having an opposite polarity to each other, the solar cell being divided into a minimum of three sub-cells, the electromagnet being supplied with electric current, while being controlled according to the output from the sub-cells.

According to a twelfth aspect of the invention, there is provided a converging solar module according to the first aspect of the invention, wherein the solar cell and the position detection means are mounted on a movable pedestal, and the cell moving means is pedestal driving means for moving the pedestal such that a converged spot is formed at a central portion of the position detection means.

According to a thirteenth aspect of the invention, there is provided a converging solar module according to the twelfth aspect of the invention, wherein the pedestal driving means can drive the pedestal in three dimensions, so that the converged spot is formed on the same plane as a surface plane of the solar cell.

According to a fourteenth aspect of the invention, there is provided a converging solar module according to the twelfth aspect of the invention, wherein the pedestal driving means is made of a shape memory alloy member.

According to a fifteenth aspect of the invention, there is provided a converging solar module according to the fourteenth aspect of the invention, wherein the position detection means has a central portion where light is not absorbed, and is surrounded by a plurality of heat collecting members fixed to the pedestal, the heat collecting members being held at edges thereof by a shape memory alloy member fixed to a stationary member.

According to a sixteenth aspect of the invention, there is provided a converging solar module according to the fifteenth aspect of the invention, wherein the heat collecting members are heat insulated from each other.

According to a seventeenth aspect of the invention, there is provided a converging solar module according to the fifteenth aspect of the invention, wherein the shape memory alloy member is formed in a shape of a spring.

According to an eighteenth aspect of the invention, there is provided a pedestal having a solar cell attached to it, wherein the pedestal is suspended via a wire having a length equal to the focal distance of a converging lens for converging solar light onto the solar cell.

As described above, according to the present invention, a small and light weight solar cell moves to where a converged spot is formed while the converging lens stays where it is. With this arrangement, since the moving means can be made small and of simple structure, it is possible to reduce the whole module in size, weight, and cost.

Application of a solar battery and a light position detection sensor ensures accurate positional detection of a converged spot.

At least three movement solar cells are mounted surrounding the power generation solar cell, so that the movement of the converged spot is traced, based on their generated electricity output, and then the power generation solar cell is moved using the output.

The solar cell is divided into three or more sub-cells, so that each of the sub-cells transmits a different level of output, according to the extent of displacement of the converged spot.

The outputs of the three or more sub-cells are compared to one another, so as to detect the extent of displacement, in other words, the current position, of the converged spot, based on which movement of the solar cell is controlled. With this arrangement, a solar battery for detecting the position of a converged spot can be omitted.

As the sun moves, the converged spot also moves accordingly so as to fall within one of the movement solar cells. The movement solar cell upon which the converged spot is formed, receives optical energy and thereby generates electricity, which is then supplied to its corresponding electromagnet. Upon receipt of the electricity, the electromagnet and the permanent magnet positioned opposite to the electromagnet begin attracting each other, as they have opposite polarities, forcing the movement solar cell to move closer to the permanent magnet, and thus the solar cell toward the position where the converged spot is now formed. Accompanying this movement, the movement solar cell is inevitably moved off the converged spot, and then stops generating of electricity and thus its movement.

The sub-cells of the solar cell respectively output different levels of electricity, depending on the light amount received, so that the position of the converged spot is detected based on the difference in the output levels. Based on the detected position, electric current is supplied to an appropriate electromagnet so as to thereby move the solar cell. With this arrangement, it is possible to move the solar cell to where the converged spot is now formed, without resorting to exclusive position detection means.

When the solar light comes into the converging lens from a changed direction, the focal point of the lens resultantly varies. Then, the position detection means is moved such that its central portion is located in the vicinity of the focal point of the lens, so as to ensure position detection at the central portion, rather than the peripheral portion, of the position detection means, to enhance the accuracy of the position detection. With this arrangement, since the converged spot always falls within the solar cell, an increased amount of electricity can be generated.

Since the pedestal driving means enables the pedestal to move in three-dimensions, it is possible to control the solar cell to be positioned such that its light receiving plane will always receive sunlight coming in at a right angle. With this arrangement, the area of the converged spot can be kept smaller than in the case where sunlight is coming in diagonally, which makes the converged spot irradiate more concentratedly on the light receiving plane, without irradiating other surrounding areas.

When employing a shape memory alloy as a pedestal driving means, the position of the pedestal can be automatically controlled with solar heat, which eliminates the need to use additional energy for driving the pedestal.

DESCRIPTION OF THE PREFERRED EMBODIMENTS

Preferred embodiments of the present invention will next be described with reference to the accompanying drawings.

Embodiment 1

Figure 1:
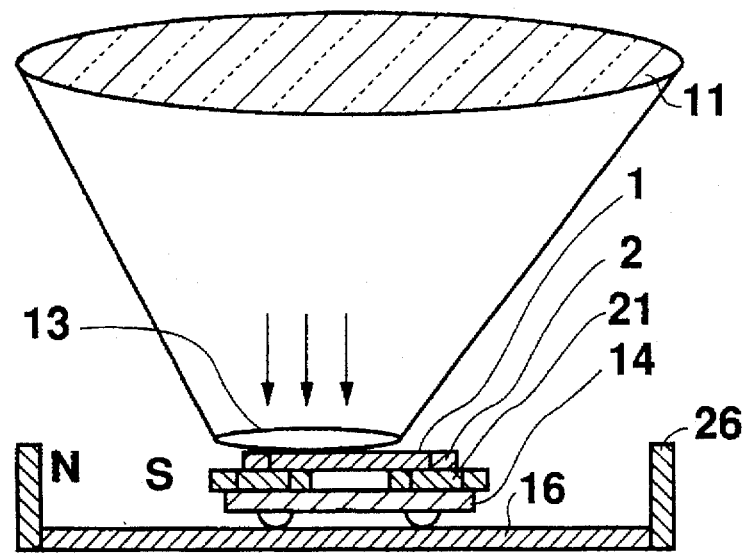
FIG. 1 is a sectional view showing a structure of a converging solar module according to a first embodiment of the present invention.
Figure 2:
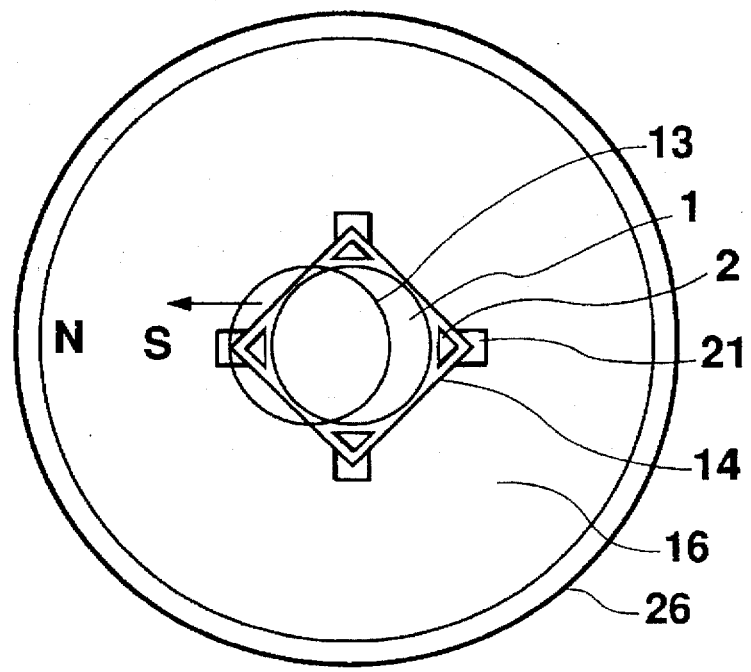
FIG. 2 is a plan view showing a structure of the converging solar module according to the first embodiment of the present invention.

FIG. 1 is a sectional view and FIG. 2 is a plan view showing the basic structure of a converging solar module according to a first embodiment of the present invention.

Below a converging lens 11, a power generation solar cell 1 and four movement solar cells 2 are situated, the former being relatively large and round, the latter being relatively small and triangular, and mounted separately around the former, having an equal space between each other. The power generation solar cell 1 is held by a cell holder 14 movably situated on a pedestal 16. The cell holder 14 is provided with a plurality of spheres rotatably attached to its bottom surface, so that as they rotate, the friction between the cell holder 14 and the pedestal 16 is minimized to allow the cell holder 14 to move on the surface of the pedestal 16 without being restricted.

The power generation and movement solar cells 1 and 2 are situated on the cell holder 14, as mentioned above, at a predetermined space apart from the cell holder 14, into which four electromagnets 21 are inserted. The respective electromagnets 21 are electrically connected to their corresponding movement solar cells 2, situated above them. When electric current is supplied to the electromagnets 21 from the movement solar cells 2, one end of the respective electromagnets 21 facing outwards from the module becomes a south magnetic pole. Meanwhile, the pedestal is provided with a permanent magnet 26 situated along its periphery, with its inner face Being a north magnetic pole. The converging lens 11 is fixed to the pedestal, through means not illustrated. The cell holder 14, the electromagnets 21, and the permanent magnet 26 constitute cell moving means of the present invention.

With the thus structured module, sunlight is converged through the converging lens 11 to form a converged spot 13 on the power generation solar cell 1, for carrying out effective electricity generation. The generated electricity is outputted through unillustrated electric lines. The power generation solar cell 1 may be the same as or slightly larger in size than the spot As the sun moves with time, the converged spot 13 also moves its position from on the generation solar cell 1 to on at least one of the four movement solar cells 2, which is thereby caused to generated electricity which is then supplied to the electromagnet 21 situated below. Upon generation of the electricity, one end of the electromagnet 21 becomes a south magnetic pole and is consequently attracted to the permanent magnet 26, which is a north magnetic pole. Accordingly, the cell holder 14 including the movement solar cell 2 is moved closer to the permanent magnet 26 until it reaches such a position that the sunlight no longer irradiates any movement Solar cells 2, so that the cell holder 14 stops moving. With the cell holder 14 in this position, the converged spot 13 falls within the power generation solar cell 1. As described above, as the sun moves, and accordingly the converged spot 13 moves, the power generation solar cell 1 automatically moves to the moved position of the converged spot 13. As a result, effective generation of electricity is constantly achieved. In particular, according to this embodiment, since the movements can be controlled without providing an optical sensor or a control circuit, the structure of the whole module can be simplified, which results in cost reduction.

Alternatively, the electromagnet 21 may be a north magnetic pole while the permanent magnet may be a south magnetic pole, opposite to the above described embodiment. Further, the movement solar cells 2 may each be electrically connected to the opposite electromagnet 21, so as to generate a repelling force, that is, a north magnetic pole there. In the above case, four pairs of movement solar cells 2 and electromagnet 21 are described, however, at least three pairs of movement solar cells 2 and electromagnets 21, could achieve the same result. Further, if the converged spot 13 is smaller than a circle formed by connecting adjacent movement solar cells 2, the cell holder 14 starts moving only when the converged spot 13 has moved to a position overlapping a movement solar cell 2. On the other hand, if the converged spot 13 is larger, the cell holder 14 stops moving when the moving forces generated by a pair of opposite movement solar cells 2 are balanced, the moving forces being either attracting or repelling forces with respect to the permanent magnet 26.

In this embodiment, movement solar cells 2 constitute the position detection means of this invention.

Assuming that the converging lens 11 has a diameter of 20 cm (a light receiving area of 314 cm$^2$), and the power generation solar cell 1 has a diameter of 2 cm (a light receiving area of 31.4 cm$^2$), the converging lens 11 receives solar energy of 31.4 W in very fine weather and the power generation solar cell 1 is irradiated with the same amount of solar energy but converged to be, in this case, 100 times more intense. With a photoelectric conversion efficiency of 18%, around 5.65 W of electricity will consequently be generated.

Assuming that each of the movement solar cells 2 has an area of 0.2 cm$^2$ the movement solar cell 2 will be irradiated with about 2 W of solar energy, when having a converged spot formed therein. With a photoelectric conversion efficiency of 18%, 0.36 W of electricity will be generated.

The electromagnet 21 is constituted of a magnetic member 2 cm long with a diameter around 0.5 cm, wound in a coil. As the solar cell, crystalline Si materials are preferable, though non-crystalline Si, GaAs, Cd, or the like, may be applied.

Embodiment 2

Figure 3:
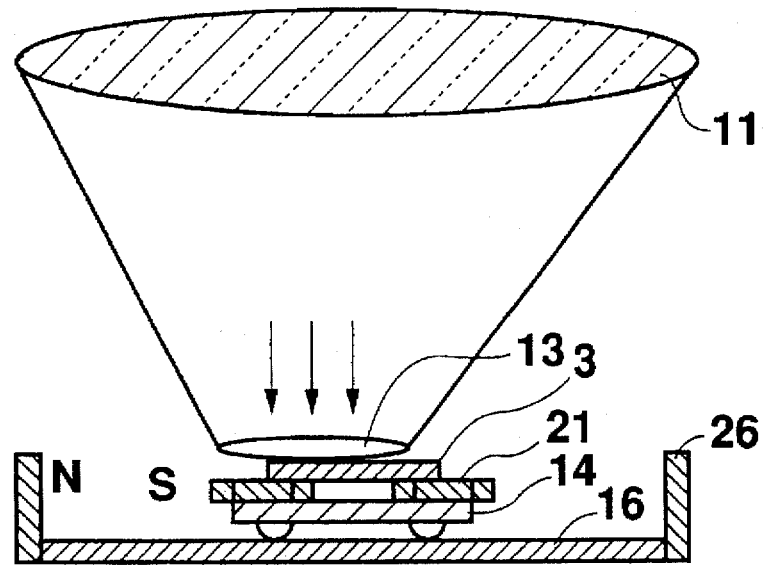
FIG. 3 is a sectional view of a converging solar module according to a second embodiment of the present invention.
Figure 4:
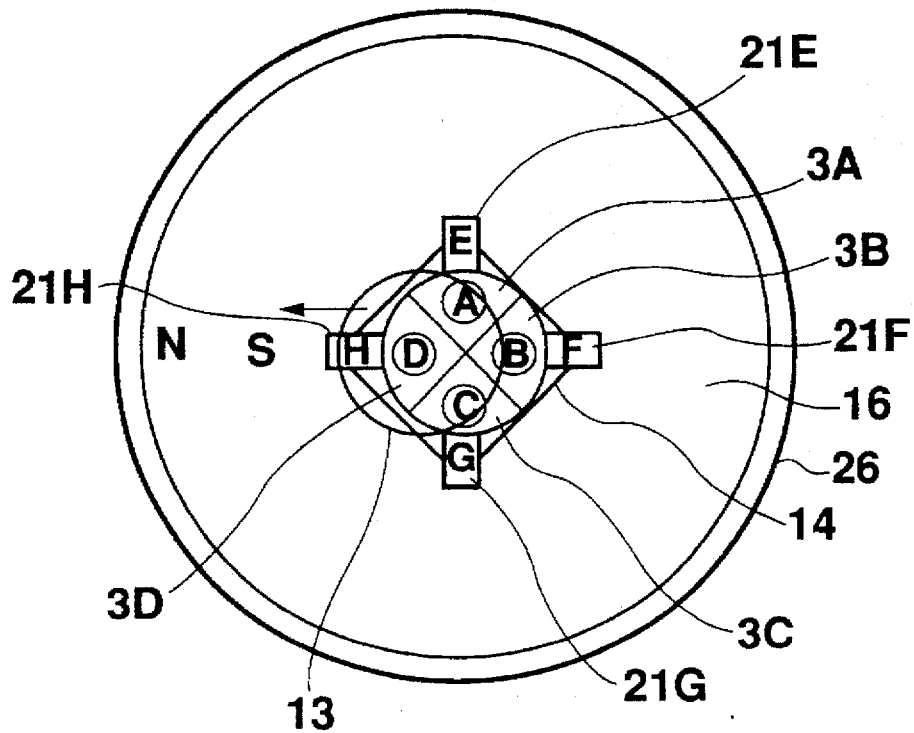
FIG. 4 is a plan view of the converging solar module according to the second embodiment of the present invention.
Figure 5:
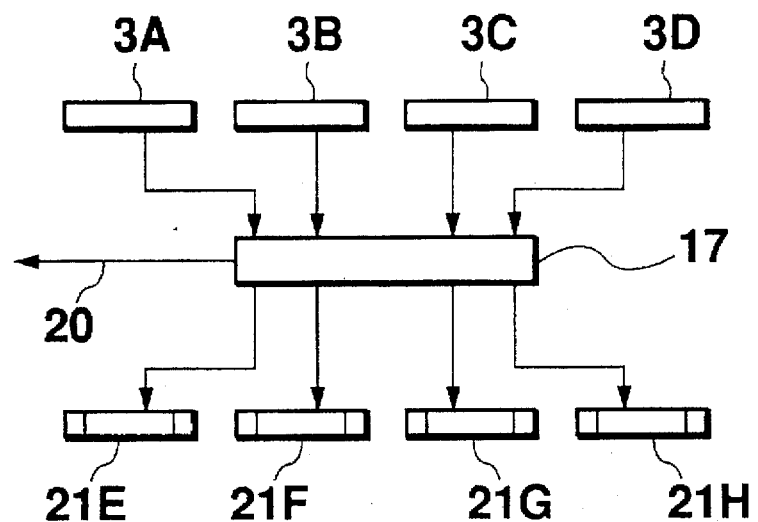
FIG. 5 is a block diagram showing a control structure of the converging solar module according to the second embodiment of the present invention.

FIG. 3 is a sectional view and FIG. 4 is a plan view showing a converging solar module according to a second embodiment of the present invention. FIG. 5 is a block diagram showing a control structure thereof. Hereinafter, the same reference numerals designate parts or elements similar to those mentioned hereinbefore, and description thereof will be omitted.

In place of the power generation and movement solar cells 1 and 2 of the first embodiment, a solar cell 3 is provided, comprising four solar battery sub-cells 3A, 3B, 3C, and 3D. That is, the solar cell 3 is round and divided into four solar battery sub-cells 3A, 3B, 3C, and 3D so as to each have a right angle. The sub-cells 3A, 3B, 3C, and 3D are each connected to an output control circuit 17, so that their respective outputs are eventually transmitted as an electric current output 20 via the output control circuit 17.

The output control circuit 17 is further connected to four electromagnets 21E, 21F, 21G, and 21H, for controlling electric current supplied thereto, based on the output condition of the four solar battery sub-cells 3A, 3B, 3C, and 3D. More particularly, with the converged spot 13 formed at the right place on the solar cell 3, the four solar battery sub-cells 3A, 3B, 3C and 3D should generate the same amount of electricity. On the other hand, when the converged spot 13 is formed at a displaced position on the solar cell 3 due to the movement of the sun, some of the cells among the sub-cells 3A, 3B, 3C, and 3D will become less covered by the converged spot 13 and accordingly generate a lower amount of electricity. In this situation, the output control circuit 17 supplies electric current to that one of the electromagnets 21E, 21F, 21G, and 21H, which is situated opposite the solar battery sub-cell generating the least amount of electricity, in other words, an electromagnet situated below the solar battery sub-cell generating the largest amount of electricity.

Taking the example of FIG. 4, the output control circuit 17 supplies electric current to the electromagnet 21H, which is located directly below the solar battery sub-cell 3D which is generating the largest amount of electricity. Then, the end of the electromagnet 21H facing outward from the module becomes a south magnetic pole, and is thus attracted to the permanent magnet 26, which is a north magnetic pole, so that the cell holder 14 is consequently moved to the left as indicated by an arrow in FIG. 4. When the cell holder 14 is moved to such a point where the respective solar battery sub-cells 3A, 3B, 3C, and 3D generate the same amount of electricity, the output control circuit 17 stops supplying electric current to any of the electromagnets 21E, 21F, 21G, and 21H.

Through the foregoing control, the cell holder 14 is moved so that the converged spot 13 is always formed at the right position of the solar cell 3, thereby achieving effective electricity generation. In particular, according to this embodiment, movement solar cells 2 can be eliminated, which contributes to a cost reduction. Further, when the output control circuit 17 and the electromagnets 21 are driven with 10 to 100% of the electricity generated by the solar cell 3, it is no longer necessary to externally feed driving power. As is apparent from the above description, the four solar battery sub-cells 3A, 3B, 3C, and 3D also serve as the position detection means in Embodiment 2.

In the above case, four sub-cells are described, although a solar cell may be divided into at least three for achieving the same result.

Embodiment 3

Figure 6:
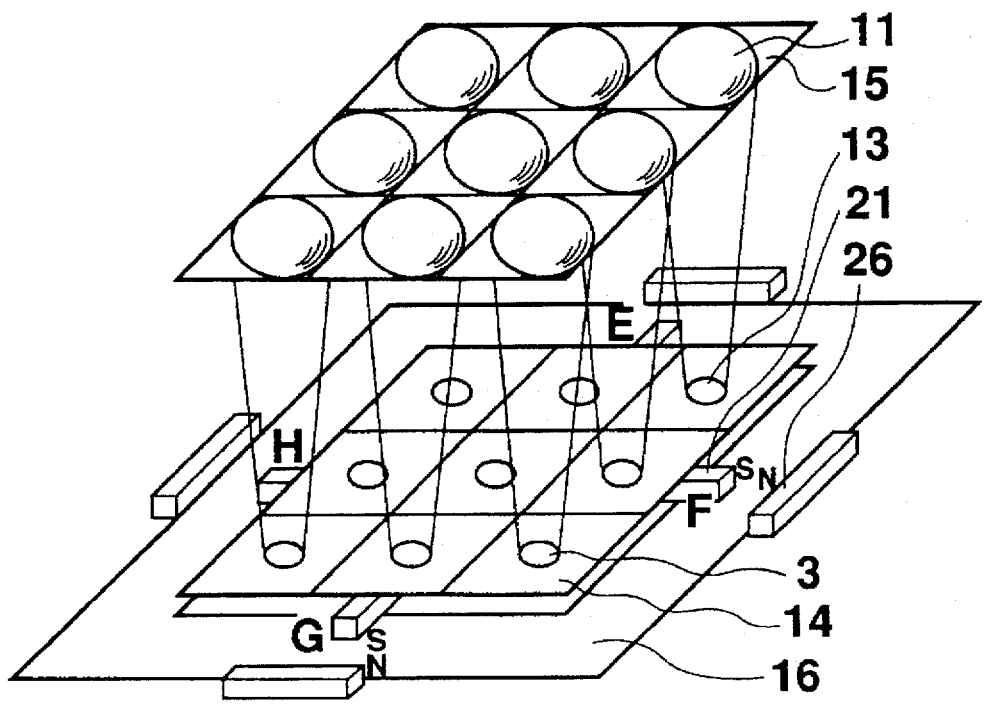
FIG. 6 shows a structure of a converging solar module according to a third embodiment of the present invention.
Figure 7:
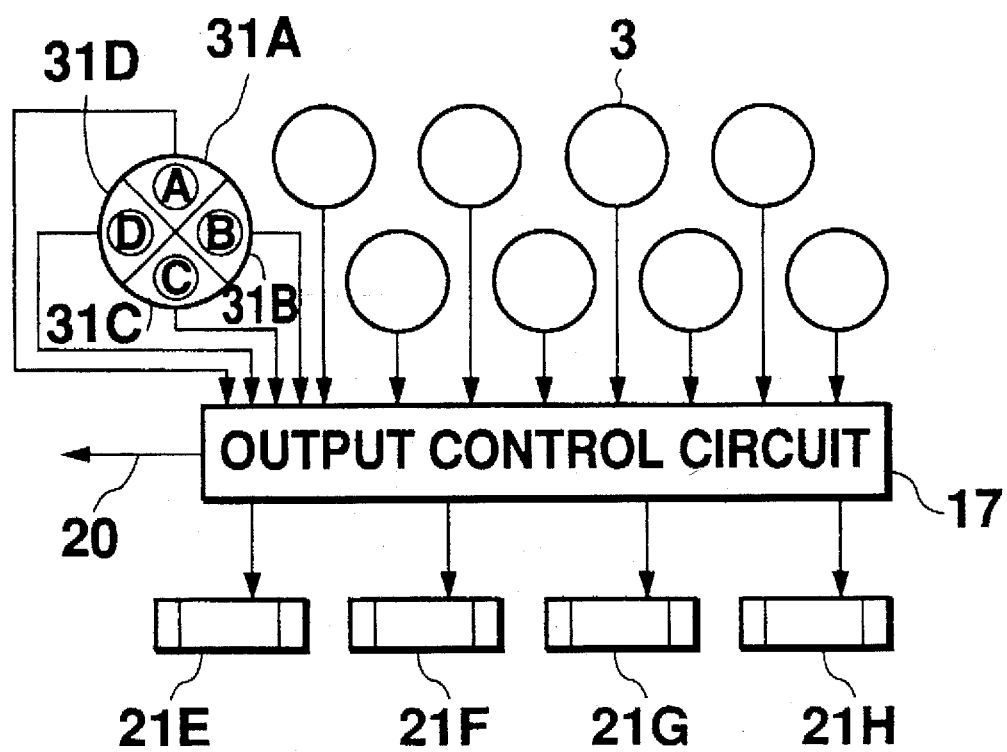
FIG. 7 is a block diagram showing a control structure of the converging solar module according to the third embodiment of the present invention.

FIG. 6 is a perspective view showing an overall structure of a converging solar module according to a third embodiment of the present invention. FIG. 7 is a block diagram showing a control structure thereof.

The module of the third embodiment comprises nine converging lenses and solar cells, respectively. That is, nine converging lenses 11 are mounted on a lens holder 15, while nine solar cells 3 are situated on the cell holder 14. Each of the nine converging lenses 11 converges incoming sunlight to form a converged spot 13 on its corresponding solar cell 3.

As shown in FIG. 7, the nine solar cells 3 are connected to the output control circuit 17, so that the respective outputs from the nine cells 3 are transmitted to the outside as an electric current output 20 via the output control circuit 17.

Among the nine solar cells 3, a solar cell 31, which is divided into four solar battery sub-cells 31A, 31B, 31C, and 31D, serves as position detection means. The solar cell 31 outputs a signal, according to which the output control circuit 17 controls the supply of electric current to the four electromagnets 21E, 21F, 21G, and 21H, and eventually the movement of the cell holder 14, so as to position the converged spot 13 on the solar cells 3.

As shown in FIG. 6, the cell holder 14 is placed on the four electromagnets 21E, 21F, 21G, and 21H, which are situated on the pedestal 16. Along and outside the periphery of the pedestal 16, permanent magnets 26 are situated surrounding the nine solar cells 3, with the faces on the cell holder 14 side being a north magnetic pole. The four electromagnets 21E, 21F, 21G, and 21H are respectively positioned such that one end thereof faces the most closely situated permanent magnet 26.

When the output control circuit 17 supplies electric current to the electromagnet 21E, 21F, 21G, or 21H, one end thereof becomes a south magnetic pole. Subsequently, in the same manner as described in Embodiment 2, the position of the cell holder 14 is moved in such a direction that the converged spots 13 fall within the corresponding solar cells 3, similar to Embodiment 2, a solar cell 31 may be divided into a minimum of three battery sub-cells for achieving the same result. In Embodiment 3, the pedestal 16, the cell holder 14, the permanent magnets 26 and the electromagnets 21E, 21F, 21G, and 21H together constitute the cell moving means of the present invention.

For obtaining an increased output of electricity generated by a converging solar module, a plurality of small converging lenses 11 and solar cells 3 may be provided. Such an arrangement serves more effectively than providing one or more larger converging lens(es) and solar cell(s), partly because it can keep the whole module small and light. Therefore, Embodiment 3 can effectively output a larger amount of electricity, as it is provided with as many as nine converging lenses and solar cells. Moreover, as a small lens has a shorter focal distance than a larger lens, a plurality of smaller converging lenses could result in a thinner module.

Note that the position of the converged spot 13 may not necessarily be detected by a solar cell 3 comprising four sub-cells, but a solar battery separately provided for position detection could achieve the same result.

Assuming that each of the converging lenses 11 has a diameter of 10 cm (a light receiving area of 78.5 cm$^2$), the total light receiving area of the whole module will be 707 cm$^2$. If the solar cells 3 has a total area of 7.07 cm$^2$, 12.7 W of electricity will be generated and outputted from the whole module on the premise that the photoelectric conversion efficiency is 18%. The four solar battery sub-cells 31A, 31B, 31C, and 31D respectively generate 0.35 W of electricity. The electromagnets 21 in Embodiment 3 preferably have a diameter of around 0.7 cm, slightly larger than that in the foregoing embodiments, Embodiment 4

Figure 8A:
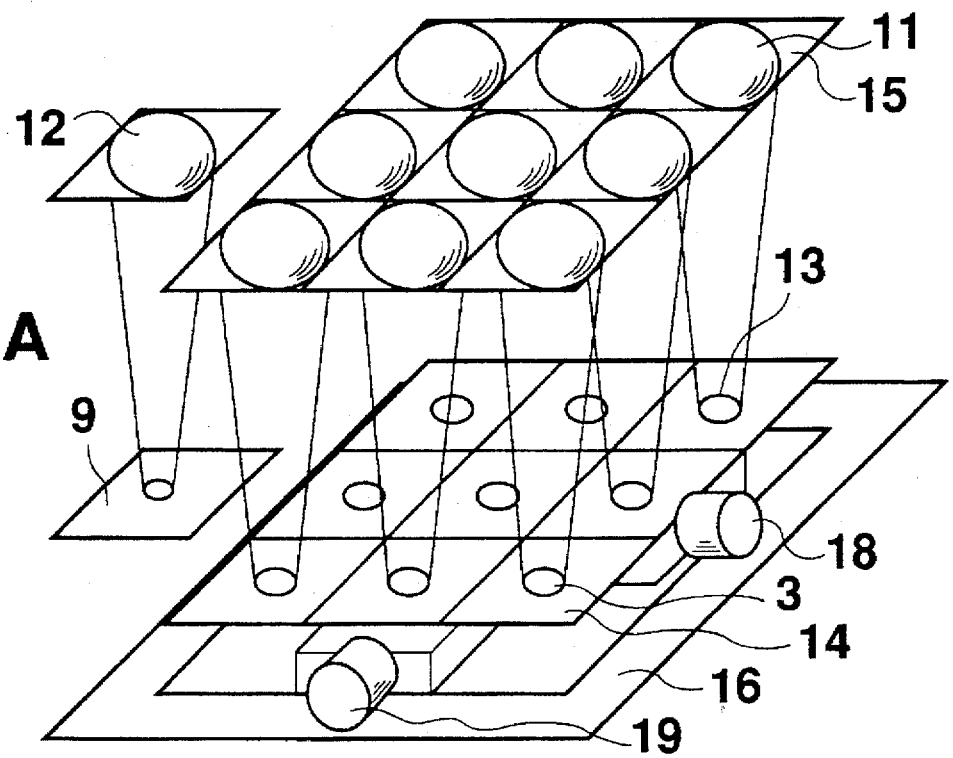
FIG. 8A shows a structure of a converging solar module according to a fourth embodiment of the present invention.
Figure 8B:
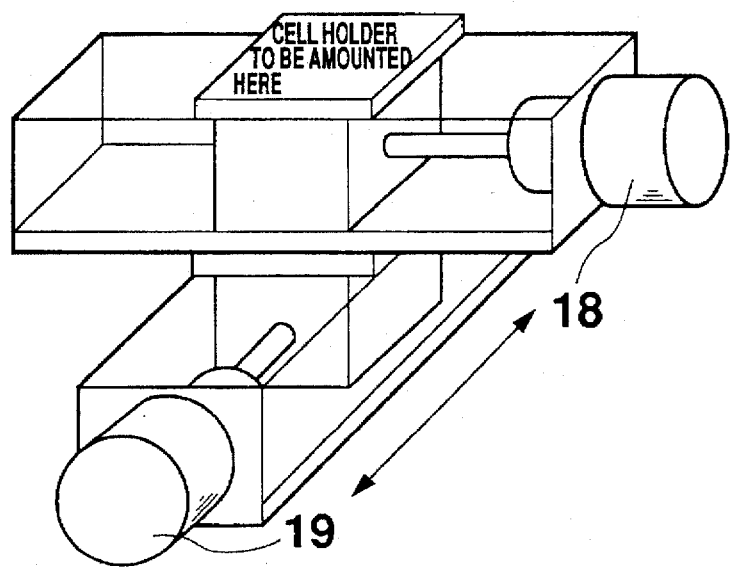
FIG. 8B shows an enlarged perspective view of the control motor.
Figure 9:
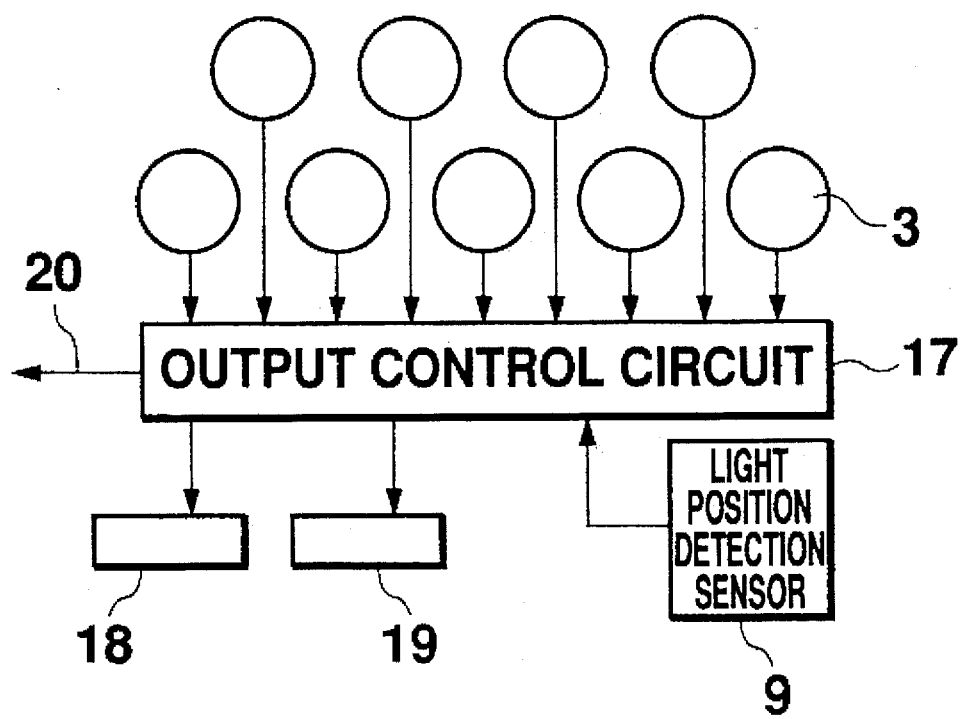
FIG. 9 is a block diagram showing a control structure of the converging solar module according to the fourth embodiment of the present invention.

FIG. 8A shows an overall structure of a converging solar module using a control motor according to the fourth embodiment of the present invention. FIG. 8B shows an enlarged perspective view of the control motor. FIG. 9 is a block diagram showing a control structure thereof.

The module is provided with an X axis control motor 18 and an Y axis control motor 19, by means of which the cell holder 14 can be moved on the pedestal 16. In Embodiment 4, the cell holder 14, the pedestal 16, and the X and Y axes control motors 18 and 19 together constitute cell moving means.

The cell holder 14 and the lens holder 15 are fixedly provided with a light position detection sensor 9 and a position detection lens 12, respectively. In Embodiment 4, the light position detection sensor 9 is a light spot position detection sensor utilizing the surface electrical resistance of a photodiode. The sensor 9 detects surface currents occurring in accordance with the position of a light spot formed on a photodiode plane, thereby detecting the position of the light spot.

Since the position of the light spot, detected by the light position detection sensor 9, has a consistent positional relationship with those of converged spots 13, it is possible to detect the position of the converged spots 13 using the light position detection sensor 9. Furthermore, the light position detection sensor 9 is connected to the output control circuit 17, which controls the driving of the X and Y axes control motors 18 and 19, according to the position of the converged spots 13, which the position detection sensor 9 has detected, to move the cell holder 14. With this arrangement, it is possible to move the cell holder 14 such that the respective converged spots 13 are formed on their corresponding solar cells 3.

By means of such position detection and movement control using a light position detection sensor 9 and motors 18 and 19, the position of a converged spot 13 can be accurately adjusted. Further, utilizing a motor could reduce the driving energy required in the movement operation, compared to the case where an electromagnet is used.

The light position detection sensor 9 may possess a received light detection section having an area of 8×8 cm. When a converged spot 13 moves away from a right position relative to solar cell 3 by more than 1 mm on the cell holder 14, it is preferable to move the solar cell 3 until the difference between them becomes equal to or less than 0.2 mm.

Figure 10:
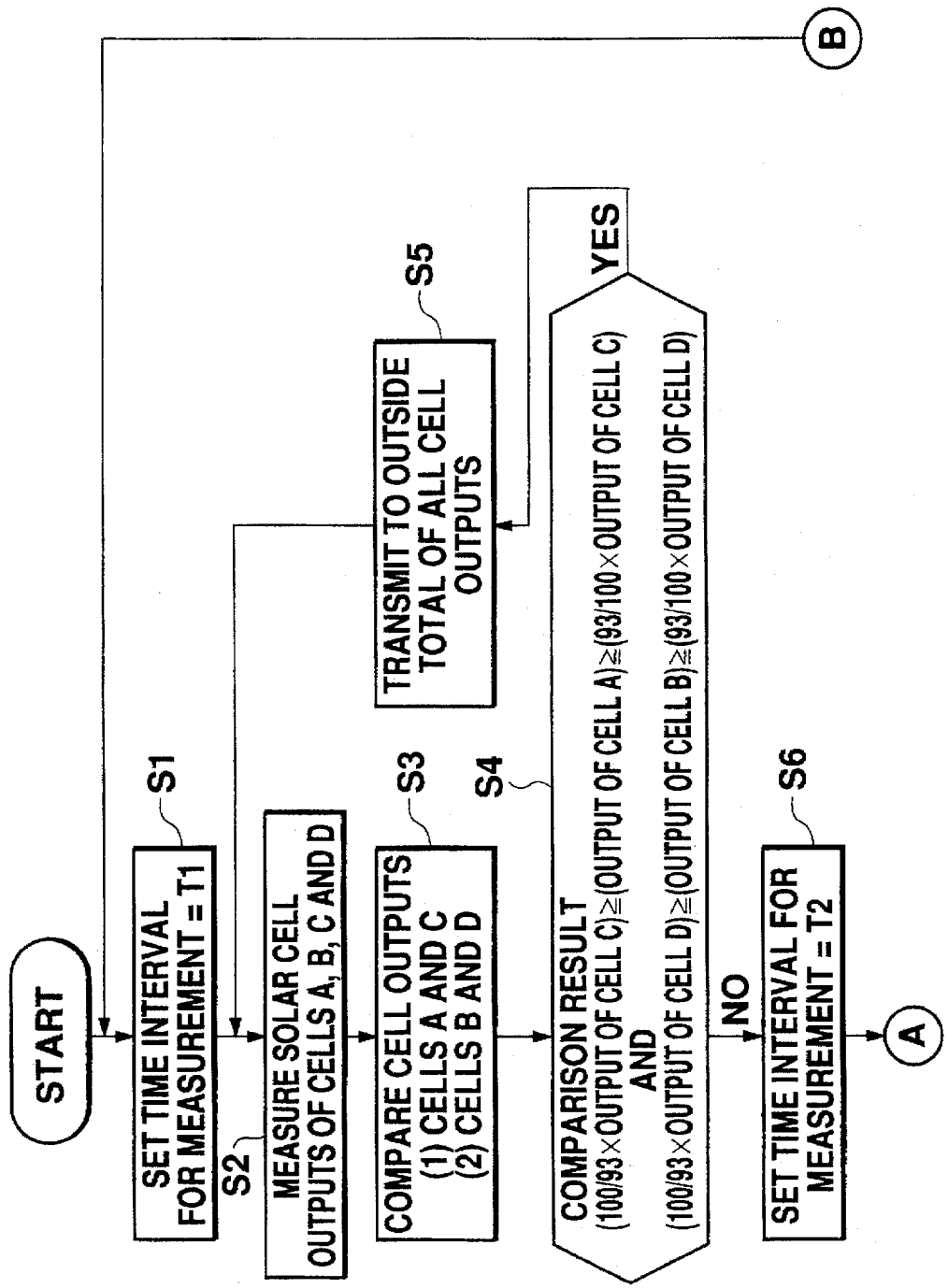
FIG. 10 is a flow chart showing operations of the converging solar module according to the second and third embodiments of the present invention.
Figure 11:
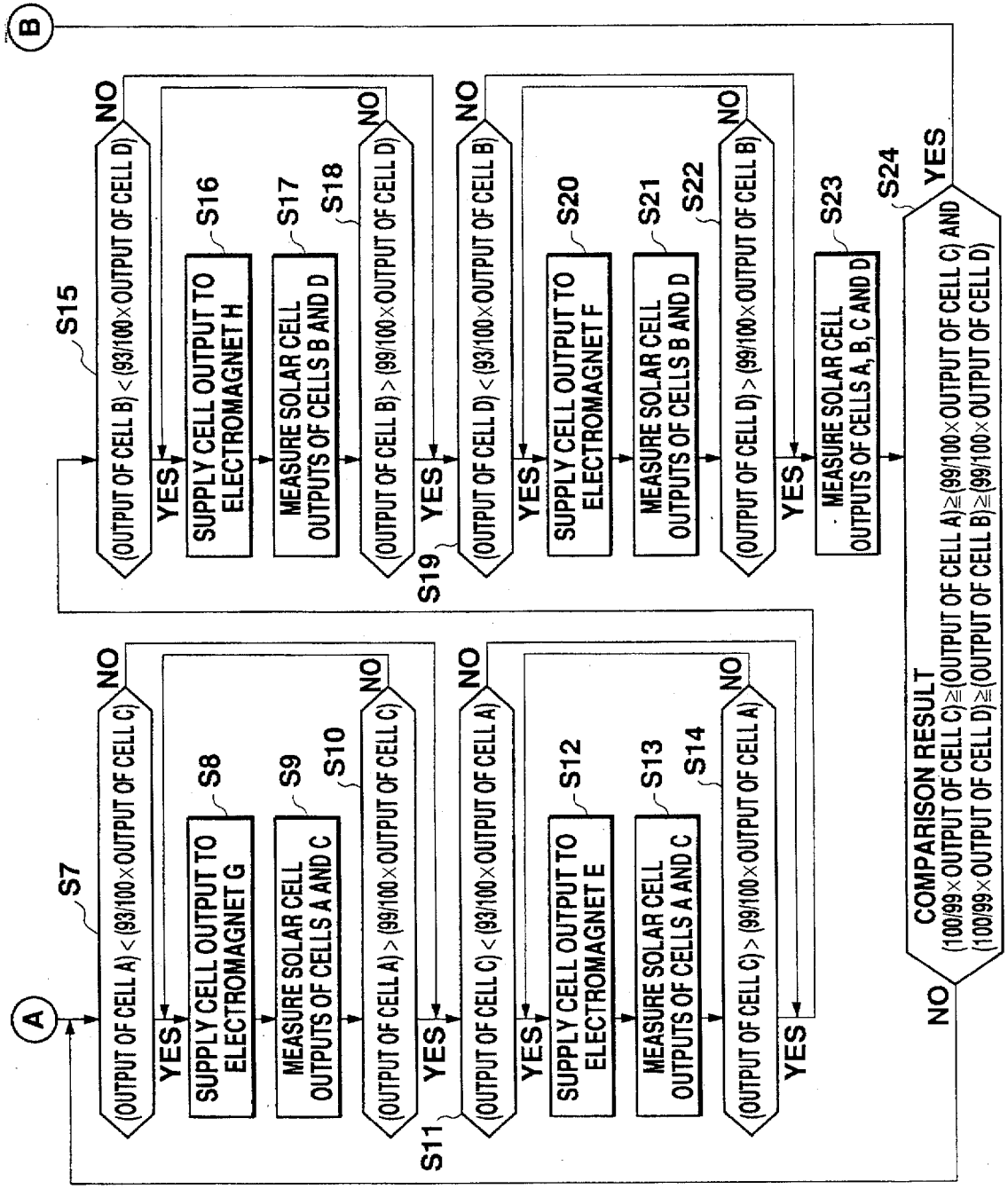
FIG. 11 is a flow chart showing operations of the converging solar module according to the second and third embodiments of the present invention.

Operation:

With reference, to the flow charts in FIGS. 10 and 11, the, operation for the movement control of the cell holder 14 by controlling the electromagnet 21 based on the detection signals from four divided solar battery sub-cells 31 in Embodiments 2 and 3 will next be described. Generated electricity is measured every 0.5–30 minutes, or T1, which is a relatively long time interval, for normal outputting, and every 0.1–10 seconds, or T2, which is a relatively short time interval, when light tracking control takes place.

In operation, a time interval for measurement T1 is first set (S1). Then, outputs from the solar battery sub-cells 31A, 31B, 31C, and 31D are respectively measured (S2). The respective measured values are compared with one another (S3), so as to see whether the following inequalities are simultaneously held (S4):

the output of the solar battery sub-cell 31C×100/93≧the output of the solar battery sub-cell 31A≧the output of the solar battery sub-cell 31C×93/100, and the output of the solar battery sub-cell 31D×100/93≧the output of the solar battery sub-cell 31B≧the output of the solar battery sub-cell 31D×93/100

In the case where the inequalities are held, it is judged that the output voltages of the four solar battery sub-cells 31A, 31B, 31C, and 31D differ from one another by only an amount within a predetermined range, which requires no movement to be made to the cell holder 14. With this judgement obtained, the solar cell 3 transmits to the outside the total outputs from all of the solar cells 3, including sub-cells 31A, 31B, 31C, and 31D (S5). On the other hand, when the inequalities are not held, it is judged that the difference exceeds a predetermined range, and therefore that the cell holder 14 needs to be moved. First, a time interval for measurement T2 is set (S2). After measuring the outputs from the solar battery sub-cells 31A and 31C, respective measured values are compared, so as to see whether the following inequality is held (S7 in FIG. 11):

the output of the solar battery sub-cell 31A<the output of the solar battery sub-cell 31C×93/100

If it is held, it means that the solar battery sub-cell 31A has come to generate a lower amount of electricity, that is, to be less overlapped by the converged spot 13. Therefore, the cell holder 14 needs to be moved in the direction of the sub-cell 31C to such a point where the converged spot 13 will overlap the sub-cell 31A to the same extent as the other sub-cells. In order to thus move the cell holder 14, electric current is supplied to the electromagnet 21G, situated below the solar battery sub-cell 31C, for a predetermined short time (S8). After the cell holder 14 is resultantly moved in the intended direction, the outputs of the solar battery sub-cells 31A and 31C are measured again to be compared with each other (S9), so as to see whether the following is true (S10):

the output of the solar battery sub-cell 31A>the output of the solar battery sub-cell 31C×99/100

If this is not true with the measured outputs, the process from S8 to S10 should be repeated until the respective outputs meet the inequality of S10.

The control described so far is applied for correction when a converged spot has moved in the direction of the solar battery sub-cell 31C.

Meanwhile, if the inequality of S7 is not held, it is not necessary to carry out the process from S8 to S10, before proceeding to the subsequent steps.

In either case where the inequality of S7 is not held or the one of S10 is held, the next step is to judge whether the following inequality is held (S11):

the output of the solar battery sub-cell 31C<the output of the solar battery sub-cell 31A×93/100

If it is held, this means that the converged spot 13 now overlaps the solar battery sub-cell 31A to a greater extent than the sub-cell 31C. In other words, the solar battery sub-cell 31C now generates a lower amount of electricity than the solar battery sub-cell 31A does, and thus the output of the former needs to be increased. For this purpose, electric current is supplied to the electromagnet 21E, situated below the solar battery sub-cell 31A, for a predetermined short time (S12). Then, the outputs of the solar battery sub-cells 31A and 31C are again measured to be compared with each other (S13), so as to see whether the following is true (S14):

the output of the solar battery sub-cell 31C>the output of the solar battery sub-cell 31A×99/100

If the above is not true, the process from S12 to S14 should be repeated until the outputs meet the inequality of S14.

If either the inequality of S11 is not held, or the one of S14 is held, the next step is to judge whether the following is held (S15):

the output of the solar battery sub-cell 31B<the output of the solar battery sub-cell 31D×93/100

Subsequently, depending on the result of judgement, a similar process as mentioned above will be conducted (S15–S18). If either the inequality of S15 is not held or the one of S18 is held, the next step is to judge whether the following is held (S19):

the output of the solar battery sub-cell 31D<the output of the solar battery sub-cell 31B×93/100

Again, depending on the result of judgement, a similar process to the one mentioned above will be conducted (S19–S22).

In this way through S7–S22, the movement control with respect to the cell holder 14 is completed, in response to the converged spot 13 being moved, so that the converged spot 13 falls correctly within the solar cell 3. At this stage, the respective outputs from the solar battery sub-cells 31A, 31B, 31C, and 31D are again measured for comparison (S23), to see whether the following inequalities are simultaneously held (S24):

the output of the solar battery sub-cell 31C×100/99≥output of the solar battery sub-cell 31A≥output of the solar battery sub-cell 31C×99/100 and the output of the solar battery sub-cell 31D×100/99≥output of the solar battery sub-cell 31B≥output of the solar battery sub-cell 31D×99/100

When a negative judgement is obtained, it means that the movement control through the processes from S7 to S22 does not attain good results, and therefore the entire processes needs to be repeated until a positive judgement is obtained with respect to the above inequalities of S24, to achieve satisfactory results. On the other hand, when the judgement is positive, it means that the movement control hah been successfully completed, which allows the procedure, going back to S1 in FIG. 10, to resume normal control, which is to be carried out when the converged spot 13 is formed at the right place.

With the above described control procedure, it is possible to carry out favorable movement control of the cell holder 14, utilizing the outputs from the four solar battery sub-cells 31A, 31B, 31C, and 31D.

Other Configurations:

The light position detection sensor 9 in Embodiment 4 may be similarly employed in Embodiments 2 and 3, so that electric current will be supplied to the electromagnets 21 while being controlled based on the detection result by the sendor 9.

Embodiment 5

Figure 12:
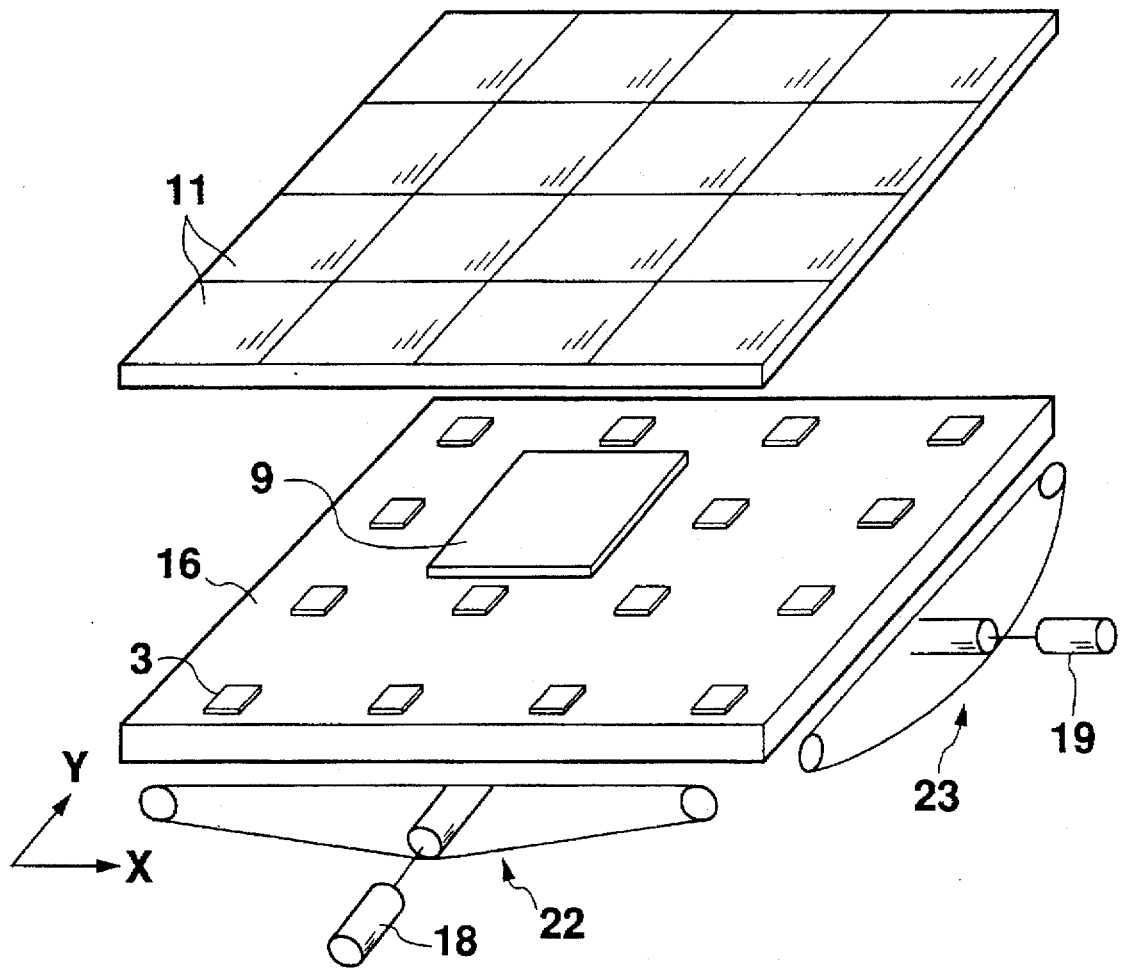
FIG. 12 shows a structure of a converging solar module according to a fifth embodiment of the present invention.

FIG. 12 shows a structure of a converging solar module according to a fifth embodiment of the present invention, in which a plurality of converging lenses 11 for collecting sunlight are fixedly arranged. Opposed to the converging lenses 11, a pedestal 16 is provided, on which a plurality of solar cells 3 are mounted, corresponding to the converging lenses 11, each at or close to the focal point of the corresponding converging lens 11, where a converged spot is formed.

Preferably, in order to secure a larger effective light receiving area, each of the converging lenses 11 is rectangular, more particularly, square, and further, they are continuously arranged without leaving a space between adjoining ones. For the purpose of cost-reduction, such plurality of converging lenses 11 are preferably unitarily made of resin, as shown in FIG. 12.

The pedestal 16 is provided with an X direction driving means 22 and a Y direction driving means 23, the former for moving the pedestal in the horizontal direction (the X axial direction in FIG. 12), the latter for moving the pedestal in a perpendicular direction (the Y axial direction). In Embodiment 5, the X and Y direction driving means 22 and 23 together constitute pedestal driving means, that is, the cell moving means of the present invention. The pedestal driving means are driven by the X axis control motor 18 and the Y axis control motor 19, or alternatively, by means of an electromagnet, or the like, without using a motor.

In Embodiment 5, one of the plurality of solar cells 3 on the pedestal 16 is replaced with the light position detection sensor 9, which serves as position detection means. In FIG. 12, the light position detection sensor 9 is provided on the pedestal 16, that is, located substantially at the center of the pedestal 16, where a converged spot is formed corresponding to one of the converging lenses 11 in a similar way to the solar cells 3.

Figures 13A, 13B:
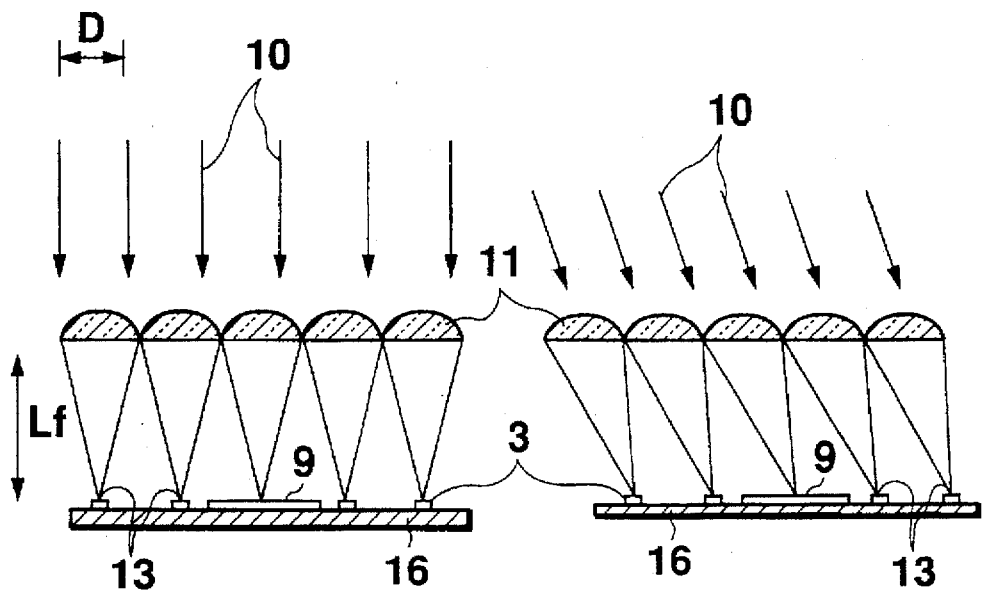
FIG. 13A is an operational diagram according to the embodiment shown in FIG. 12.
FIG. 13B is an operational diagram according to the embodiment shown in FIG. 12.

FIGS. 13A and 13B are operational diagrams according to Embodiment 5 of the present invention.

FIG. 13A shows a case Where sunlight 10 irradiates the converging lenses 11 from directly above. With this irradiation, the converged spots 13 are formed via their corresponding converging lenses 11 on the light receiving surface of their corresponding solar cells 3/light position detection sensor 9, located directly below the respective converging lenses 11. With such a converged spot 13 formed thereon, each of the solar cells 3 carries out electricity generation. In this case, the light position detection sensor 9 is positioned such that the converged spot 13 is formed at its center, the center including a central portion of the surface of the light position detection sensor 9 and its surrounding area.

FIG. 13B shows a case where sunlight 10 diagonally irradiates the converging lenses 11. As the sun moves with time, the incident angle of the irradiating sunlight 10 with respect to the converging lens varies gradually, according to which the position of the converged spot 13 is also moved. Taking this fact into consideration, the position of the pedestal 16 is controlled by means of the X and Y direction driving means 22 and 23 such that a converged spot 13 is always formed at the center of the light position detection sensor 9. Since the center of the light position detection sensor 9 corresponds to a solar cell 3, with the foregoing arrangement, sunlight 10 is converged through the respective converging lenses 11 so as to always form a converged spot 13 on the corresponding solar cell 3.

Figure 14:
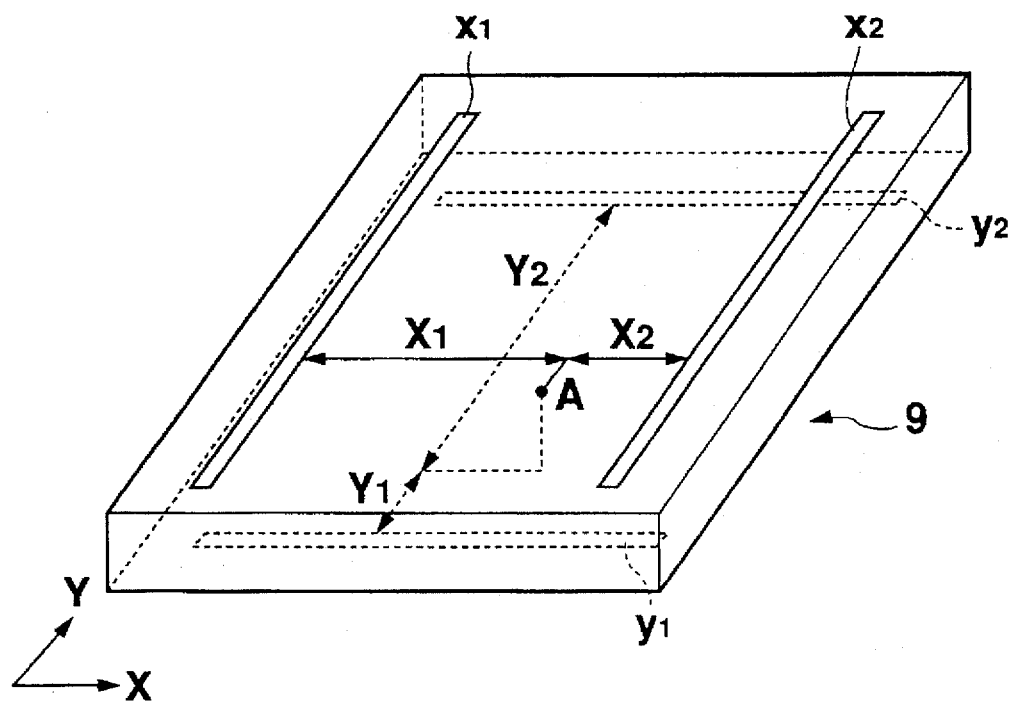
FIG. 14 shows a structure of the light position detection sensor used in the embodiment shown in FIG. 1.

FIG. 14 shows a light position detection sensor 9 according to Embodiment 5 of the present invention, which has an area equal to or larger than the converging lens 11, up to the maximum size which will not contact the adjoining cells 3, to ensure that a converged spot 13 is always formed at the central portion of the light position detection sensor 9, irrespective of the incident angle of the sunlight 10.

The light position detection sensor 9 comprises a position detection element (hereinafter referred to as a PSD element) or the like, which is provided with electrodes x1 and x2 formed on its front surface, and electrodes y1 and y2 formed on its rear surface, respectively, the former two for detecting a position in the X direction, the latter two for detecting a position in the Y direction.

An example is shown in FIG. 14, where a converged spot 13 is formed on Point A on the front surface of the light position detection sensor 9. In this case, electromotive forces Vx1 and Vx2 are generated at the electrodes x1 and x2, respectively, the electromotive, forces Vx1 and Vx2 being respectively inversely proportional to the distances X1 and X2 between Point A and the electrodes x1 and x2. After comparing the generated electromotive forces, the pedestal 16 is moved by means of the X direction driving means 22 in the direction of the electrode generating the larger electromotive force.

Likewise, since electromotive forces Vy1 and Vy2 are generated at the electrodes y1 and y2, respectively, the electromotive forces Vy1 and Vy2 being respectively inversely proportional to the distances Y1 and Y2 between Point A and the electrodes y1 and y2, the pedestal 16 is moved by means of the Y direction driving means 23 in the direction of the electrode generating the larger electromotive force.

With the above mentioned control, the pedestal 16 is moved so as to be positioned such that the two components of each of the two electrode pairs, that is, (x1,x2) and (y1,y2), generate equal electromotive forces. When the pedestal 16 is thus positioned, a converged spot is formed at the center of the light position detection sensor 9. As such a control can be carried out simply through a comparison between electromotive forces generated at respective electrodes, by applying the control, it is possible to attain a high detection accuracy in the moving control on a device of a simple structure. Although a light position detection sensor 9 generally tends to have a deterioration problem in detection accuracy at its peripheral portion rather than its central portion, the position control in Embodiment 5 can nevertheless achieve high accuracy since it controls a converged spot so as to always be formed at the center of the light position detection sensor 9.

It is preferable that the converging solar module, which comprises the converging lens 11, the pedestal 16, the solar cell 3, the X direction driving means 22, the Y direction driving means 23, and the light position detection sensor 9, is designed to be a thinner module in order to ensure a wider range of application. For this purpose, the converging lens 11 should be a lens having a shorter focal distance Lf.

For obtaining a shorter focal distance Lf, as the first alternative, a lens may have a reduced lens dimension D while retaining an analogous shape, made of the same material, and with the same curvature. Since analogous lenses with different dimensions cause passing light to be deflected to the same extent at corresponding points between larger and smaller analogous ones, in the case of a lens with a larger dimension reduction percentage, passing light focuses on a closer position to the lens. This results in a shorter focal distance Lf. As the second alternative, a lens may have a larger curvature. The larger the curvature becomes, the more largely light deflects at any point of the lens. This also causes the light to focus on a position closer to the lens, resulting in a shorter focal distance Lf.

Among the above alternatives, however, the second alternative, that is, a lens with a larger curvature, simultaneously results in a thicker lens and consequently in an increase of absorbed light, which is preferably kept small. To reduce the absorbed light, a lens with a smaller lens dimension D is preferably used as a lens with a shorter focal distance Lf.

The optimum dimension of the converging lens 11 differs depending on the usage of a converging solar module. Taking as an example, a module mounted in a vehicle, a module of less than 200 mm thickness is preferred. In this case, in view of providing pedestal driving means, that is, the X and Y axes control motors 18 and 19, the converging lens 11 preferably has a focal distance Lf of 50–100 mm, and a lens dimension D of 20–50 mm.

A converging lens 11 with a convergence of about 20–100 times is considered acceptable, considering battery and heat characteristics, costs, and the like, of a solar cell 3, and in view of this, it is preferable that the solar cell is a square measuring 2–10 mm.

Embodiment 6

Figure 15A:
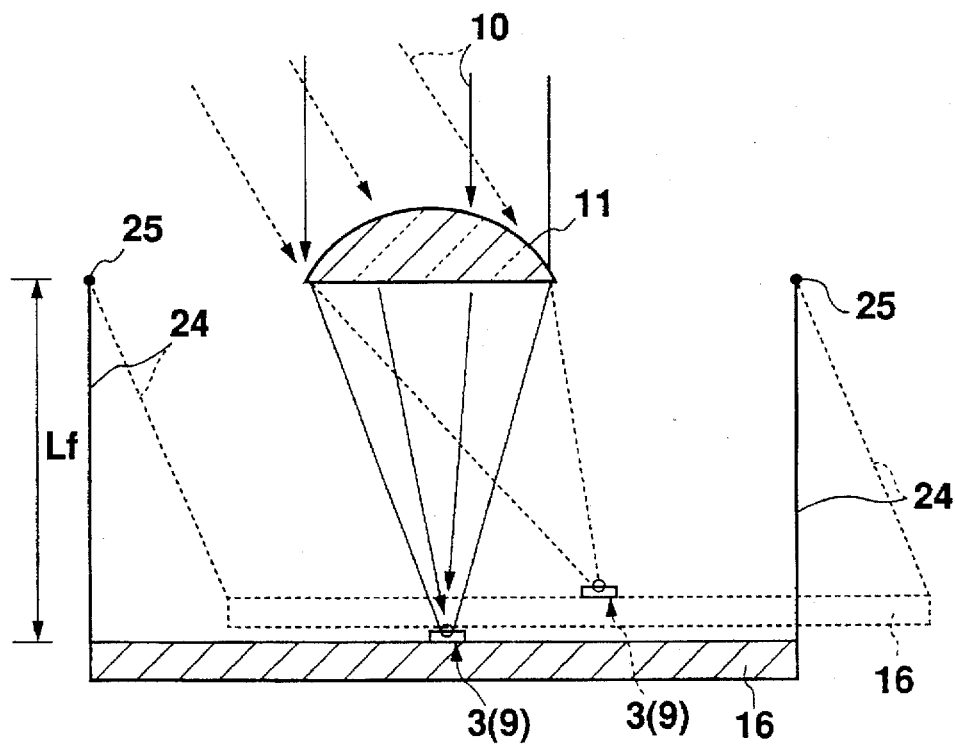
FIG. 15A is an operational diagram of a converging solar module according to a sixth embodiment of the present invention.
Figure 15B:
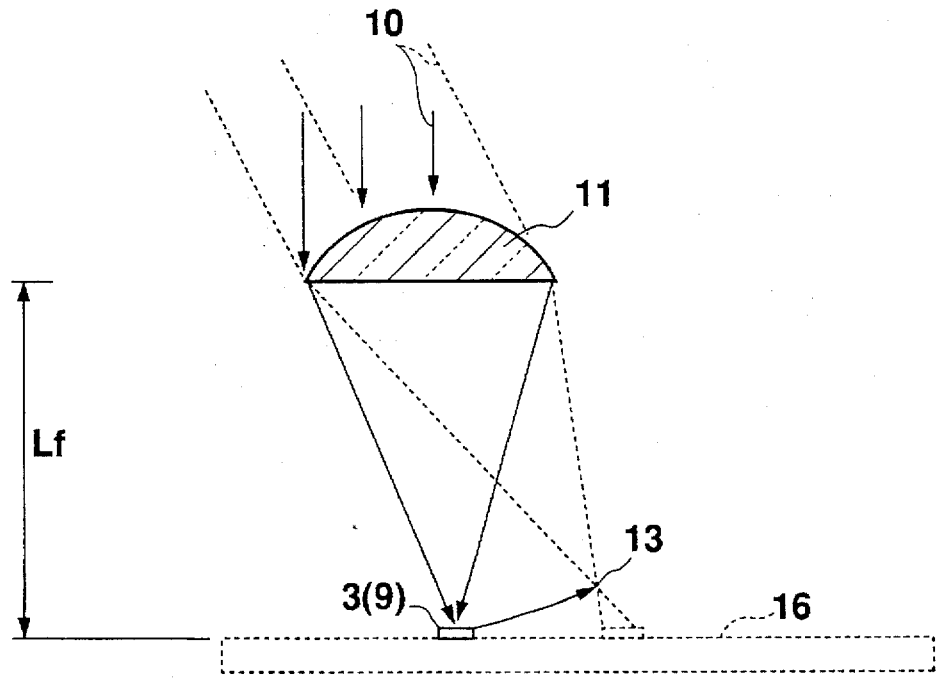
FIG. 15B is an operational diagram of the converging solar module according to the sixth embodiment of the present invention.

FIGS. 15A and 15B show the structure of a converging solar module according to a sixth embodiment of the present invention.

As shown in FIG. 15A, the pedestal 16, which has the solar cell 3 and the light position detection sensor 9 attached thereto, is suspended at each of the four corners via wires 24, each having a length equal to the focal distance Lf of the converging lens 11.

Sunlight 10 irradiates the pedestal 16 perpendicularly as indicated with a solid line in FIG. 15B. Accompanying the movement of the sun with time, however, the sunlight 10 eventually irradiates it diagonally as indicated with a broken line. Although the sunlight 10 changes its incident angle with respect to the pedestal 16, since the focal distance of the converging lens 11 remains the same, the focal point moves along a circular arc having the focal distance as a radius, accompanying the change in the incident angle.

In other words, since the position where the converged spot 13 is formed through the converging lens 11 is moved upward away from the solar cell 3 and the light position detection sensor 9, a simple horizontal movement of the pedestal 16 cannot accurately track the converged spot 13 thus moving. As a result, the sunlight 10 radiates outwardly, which causes parts thereof to irradiate areas other than the solar cell 3, resulting in a reduced amount of electricity generated by the cell 3. Further, in this event, since the sunlight 10 irradiates a larger area on the light position detection sensor 9, the accuracy in position detection is also adversely affected.

In order to cope with this problem, by also moving the pedestal 16 also along a circular arc, as shown in FIG. 15A, it is ensured that the converged spot 13 always falls within the light position detection sensor 9.

In other words, when the sunlight 10 is incident diagonally with respect to the pedestal 16, the pedestal 16 is first moved to an appropriate position in the horizontal direction by the pedestal moving means, illustrated in FIG. 12. During this movement, since it is suspended via the wires 24 equal in length to the focal distance Lf of the converging lens 11, the pedestal 16 is inevitably moved upward to the same extent as the converged spot 13 has moved upward, due to the diagonal irradiation, while following the circular arc having the wire length as a radius. Since this movement is identical to that of the converging point 13, the converged spot 13 is always focused on the light position detection sensor 9. As described in the above, with the arrangement of Embodiment 6, the pedestal 16 is movable three-dimensionally, namely, in the Z direction in addition to the X and Y directions as shown in FIG. 12.

As described in the above, the solar cells 3 and the light position detection sensor 9 are always moved so as to be positioned at a point where a converged spot 13 is then formed, thereby achieving highly accurate position detection and a large amount of electricity generation.

Embodiment 7

Figure 16:
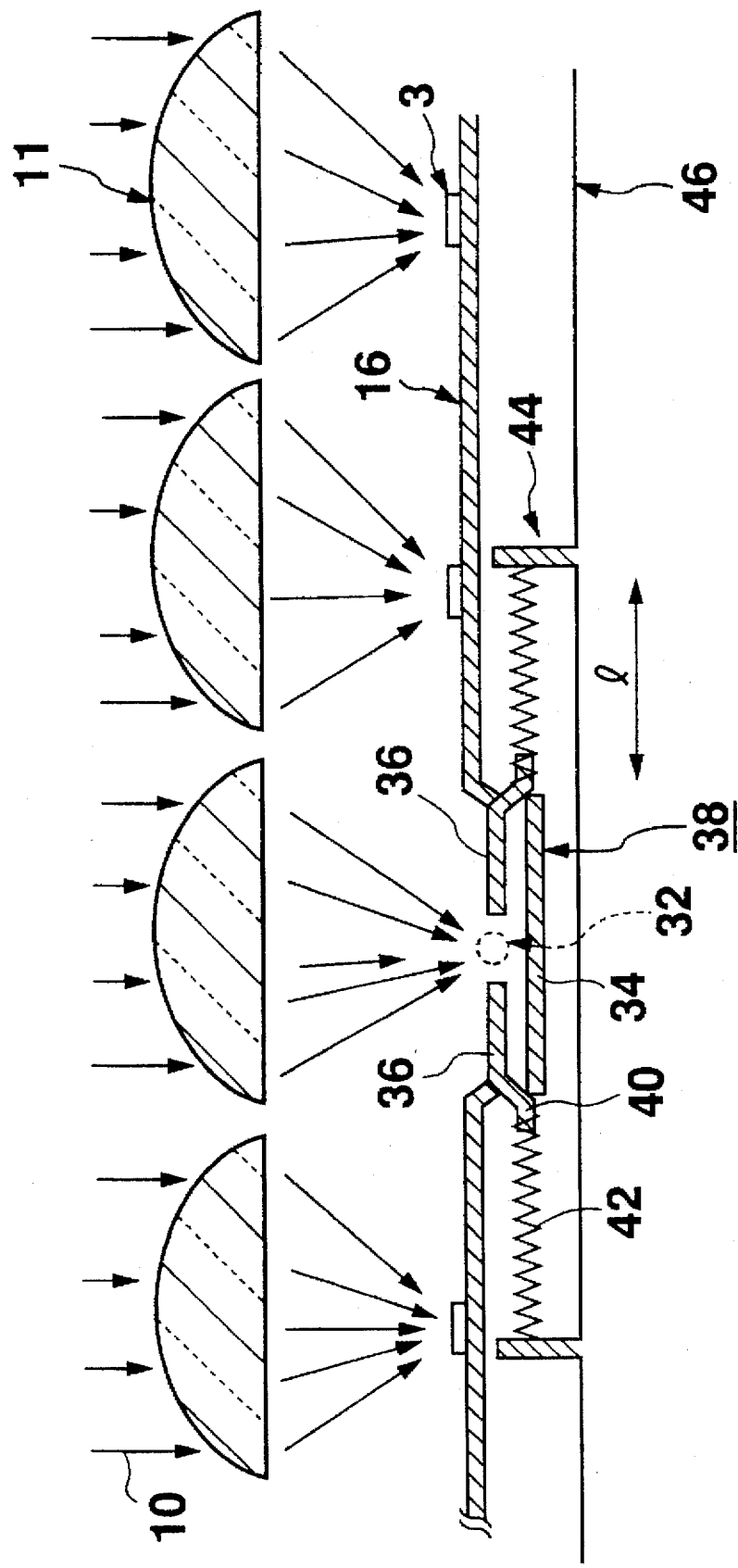
FIG. 16 is a sectional view showing a structure of a converging solar module according to a seventh embodiment of the present invention.

FIG. 16 is a sectional view of a converging solar module according to a seventh embodiment of the present invention, in which a plurality of converging lenses 11 are fixedly arranged, so that sunlight 10 is converged through them to form converged spots at or close to the focal points of the corresponding lenses 11.

Opposed to the converging lenses 11, the pedestal 16 is provided, on which solar cells 3 are mounted respectively where the converged spots are formed.

Figure 17:
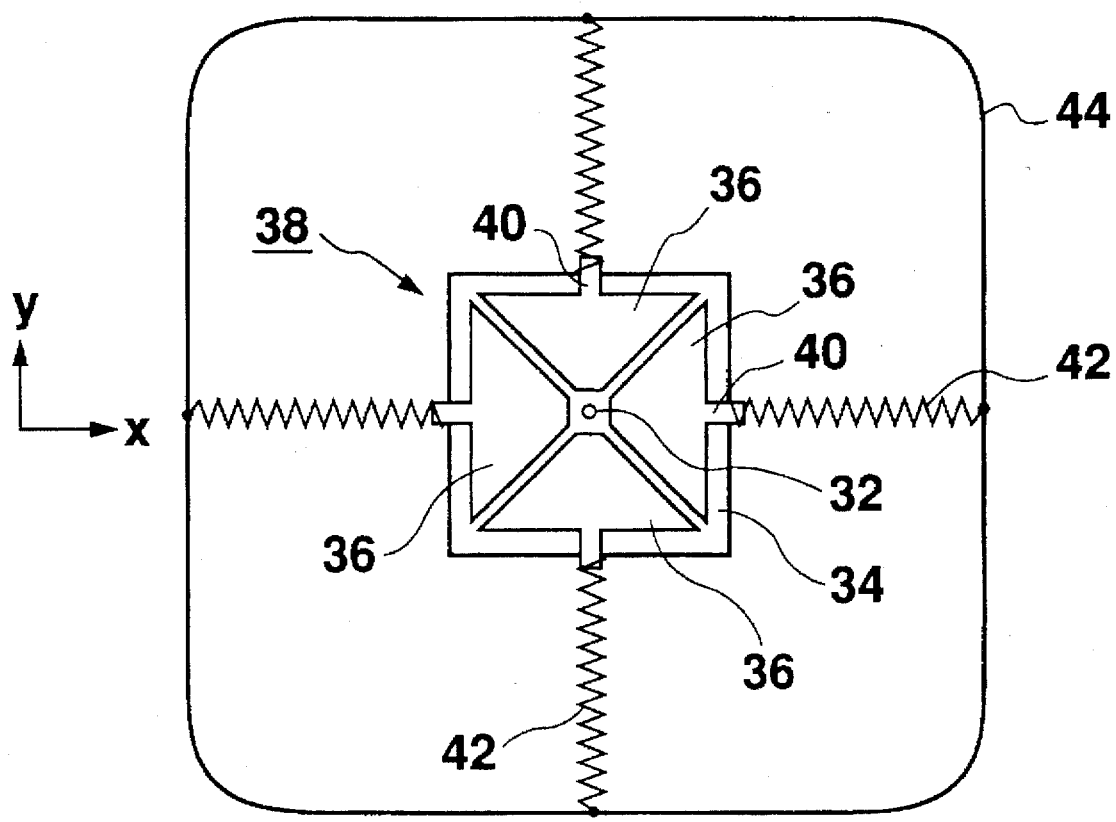
FIG. 17 is a plan view showing a structure of the position detection means used in the embodiment shown in FIG. 16.

On the pedestal 16, in addition to the solar cells 3, a heat collecting panel 36 is also fixedly mounted, and it is also attached to a heat collecting panel installation board 34. The heat collecting panel 36, which corresponds to the heat collecting member of the present invention, constitutes position detection means. FIG. 17 is a plan view of the position detection means, in which the heat collecting panel 36 is divided into four sub-panels, each in the shape of an isosceles triangle. The four sub-panels are positioned so as to together constitute a rectangle, by arranging vertexes each between of the two equal sides of the triangle to face one another. The base side of each triangle is provided with a projection 40, to which one end of a shape memory alloy spring 42 is connected. The other end of the spring 42 is fixed to a spring holding frame 44, which is in turn attached to the back face 46 of the module. The shape memory alloy spring 42, which is designed so as to contract at a temperature above a predetermined threshold, constitutes the pedestal driving means of the present invention. The pedestal driving means in this embodiment, however, is not limited to a spring, but may be constituted by any member which can move the pedestal 16 utilizing a shape memory alloy.

In operation, sunlight 10 is converged through the converging lens 11, so as to focus at or close to the focal point of the lens 11, that is, at a central portion 32 of the position detection means 38, which is mostly covered by the heat collecting panel 36, except at its central portion 32. Since the central portion 32, which has an identical size and shape to that of the solar cell 3, corresponds to the solar cells 3, which are mounted on the pedestal 16, when the sunlight 10 is converged to form a converged spot at the central portion 32, it also forms converged spots on respective solar cells 3.

Accompanying the movement of the sun with time, the sunlight 10 eventually diagonally irradiates the converging lens 11, so that the position of the converged spot varies accordingly from at the central portion 32 to on one of the four sub-panels of the heat collecting panel 36. The sub-panel of the heat collecting panel 36 with the converged spot formed thereon, increases in temperature due to the solar energy received, and transmits the heat energy via the projection 40 to the connected shape memory alloy spring 42. Upon receipt of the thus transmitted heat, the shape memory alloy spring 42 also increases in temperature to a predetermined threshold, which then triggers contraction of the spring 42. With the spring 42 being contracted, the position detection means 38 is forced to move in the direction of the contracted spring 42, where the converged spot is now formed, until the converged spot again falls within the central portion 32 of the position detection means 38.

Since the heat collecting panel 36 of the position detection means 38 is fixedly connected to the pedestal 16 provided with the solar cells 3, when the position detection means 38 is moved by means of the shape memory alloy spring 42 such that the converged spot is formed at its central portion 32, the connected pedestal 16 is also moved in a similar way, so that other converged spots are formed at the solar cells 3.

Since the heat collecting panel 36 of the position detection means 38 is divided into four sub-panels, as shown in FIG. 17, to each of which a shape memory alloy spring 42 is connected, the position detection means 38 is movable both in the x and y directions, which allows accurate tracking of a converged spot moving in any direction.

For a more accurate tracking of a converged spot, the heat collecting panel 36 may be better divided into a larger number of sub-panels so as to increase the number of directions in which the position detection means 38 can move. However, if too many memory alloy springs 42 are provided in accordance with an increased number of sub-panels, pulling forces of the respective springs 42 will set off movement of the position detection means 38. Therefore, the heat collecting panel 36 is preferably divided into two to six sub-panels.

When the central portion 32 of the position detection means 38 is constituted so as to penetrate or reflect light but not to absorb it, when the sunlight 10 is irradiating the central portion 32, heat energy is not generated and thus not transmitted from the heat collecting panel 36 to the shape memory alloy spring 42, whereby the shape memory alloy spring 42 keeps its temperature lower than a threshold value. Although it will contract with a large force at a temperature above the threshold value, and consequently move the position detection means 38 and the pedestal 16, the shape memory alloy spring 42 will contract only with a force in accordance with its spring factor and the extent of displacement extent at a temperature below the threshold. Thus, with a small spring factor set in advance, the spring will have only a reduced restriction force at a temperature lower than the threshold. In the case where the restriction force is small, even if the position detection means 38 is moved to such a point where the converged spot is formed at its central portion 32 by means of a contraction force of the spring 42 and the temperature of the spring 42 is lowered after a while, the position detection means 38 will stay at its moved position, since the friction or resistance forces caused by the movement are larger than such a small restriction force of the spring 42, and the spring 42 resultantly remains contracted. Therefore, it is possible to hold a converged spot formed at the central portion 32 of the position detection means 38. In other words, when the shape memory alloy spring 42 is given only a small restriction force, even after its temperature is lowered, the position detection means 38 is prevented from being moved back to the position before the movement with such a small restriction force, whereby a displacement is also prevented from again being caused between its central portion 32 and the converged spot. More specifically, the pedestal 16 and position detection means 38 stay at the position to which they have moved, while a converged spot 13 remains formed at the central portion 32 of the position detection means 38.

The optimum specification of the shape memory alloy spring 42 should be determined, depending on usage of a converging solar module, weight, and moving extent (as indicated by 1 in FIG. 16) of a mobile part of the pedestal 16 and position detection means 38. Nickel titanium (NiTi) alloy or the like may be employed, as it is commercially available inexpensive, and reliable.

As shown in FIG. 17, respective sub-panels of the heat collecting panel 36 are arranged having some space between adjoining each other. If a converged spot falls on the interval space, the temperature of the sub-panel of the heat collecting panel 36 does not increase as desired, which may deteriorate the accuracy in tracking a converged spot. In order to prevent this problem, the sub-panels of the heat collecting panel 36 are arranged such that adjoining ones partly overlap each other without leaving a space between them. In this arrangement, the sub-panels of the heat collecting panel 36 should be heat insulated, since heat transmitted from one panel to an adjoining one would invalidate the tracking operation of a converged spot.

Figure 18:
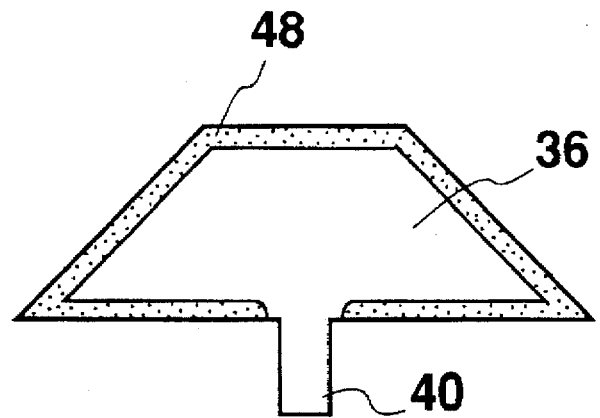
FIG. 18 is a plan view of an example of a heat collecting panel used in the embodiment shown in FIG. 16.
Figure 19:
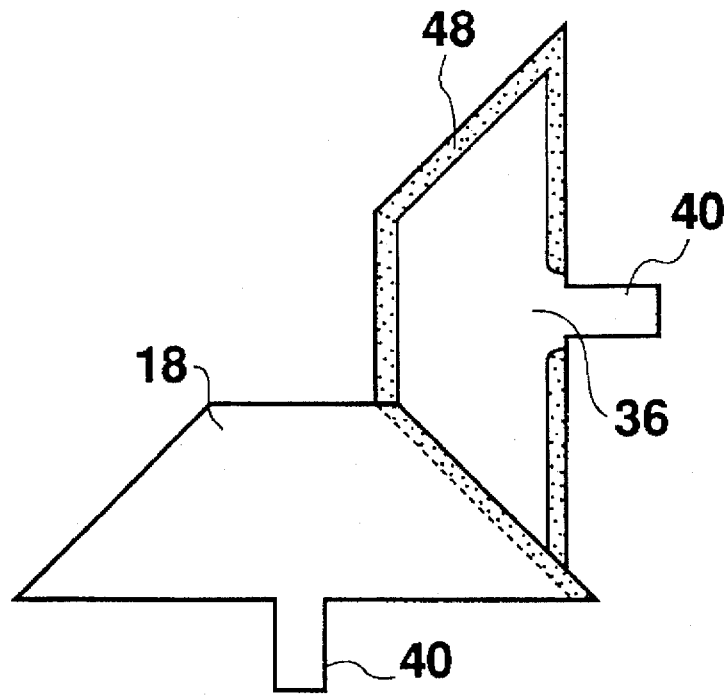
FIG. 19 is a plan view of an example of a heat collecting panel used in the embodiment shown in FIG. 16.
Figure 20:
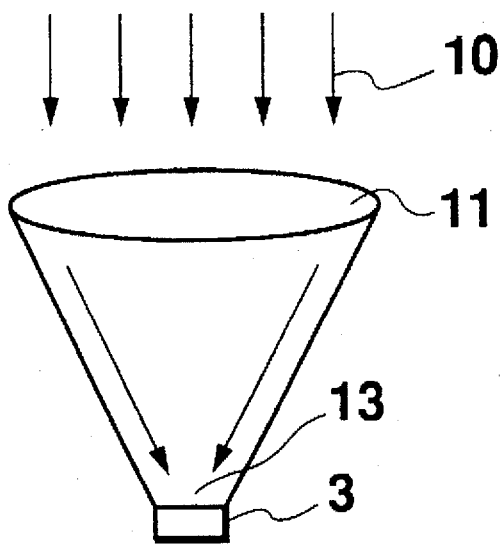
FIG. 20 shows a converged spot and a solar cell having such a positional relationship that they coincide with each other.
Figure 21:
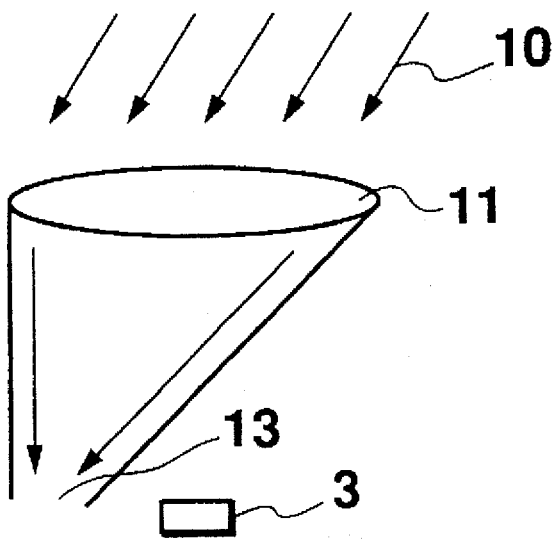
FIG. 21 shows a converged spot and a solar cell having such a positional relationship that they do not coincide with each other.
Figure 22:
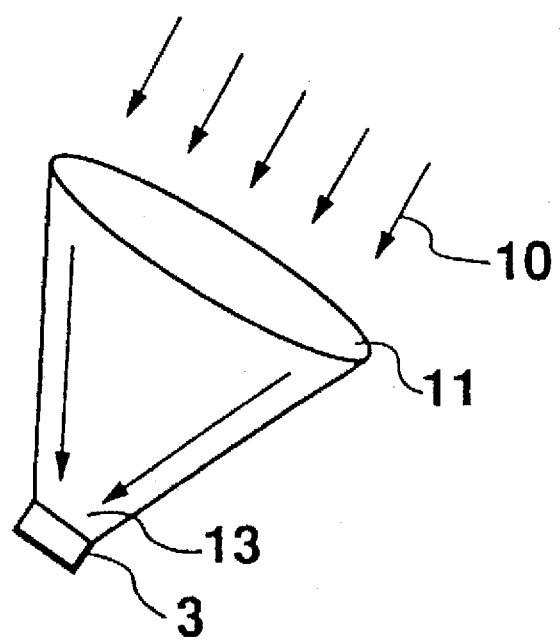
FIG. 22 shows a prior art in which a converging lens is moved to track sunlight.

FIGS. 18 and 19 show an example of a heat collecting panel, in which a sub-panel of the heat collecting panel 36 is covered with a heat-insulating resin 48 along its periphery. By placing thus covered sub-panels so as to overlap adjoining ones at the resin-covered parts, as shown in FIG. 19, it is possible to arrange them having no space between adjoining panels, while preventing heat transmission via the overlapped parts. For the sake of brevity, FIG. 19 shows only two sub-panels overlapped with each other, with others omitted. Alternatively, the sub-panels of the heat insulating panel 36 may be arranged such that each will only contact with, but not overlap, its adjoining ones, to achieve the same effect. Further, only one of the adjoining sub-panels may be heat insulated, as is shown in FIG. 18.

The heat collecting panel 36 may be made from aluminum (Al) or copper (Cu), which has a large light deflection rate. Thus, it is preferable to reduce a light deflection of such metallic materials by painting a black selective absorption film on the surface so as to selectively absorb sunlight having a wavelength within a range of 3000 angstroms to 2 μm, or making the surface rough and uneven.

In Embodiment 7, the pedestal 16 is movable two-dimensionally, that is, in the x and y directions, as is shown in FIG. 17, though preferably it is set to be movable three-dimensionally by providing an increased number of shape memory alloy springs 42.

Further, since the contraction performance of a shape memory alloy spring 42 tends to be degraded with an excessive increase in temperature, which may result in a shorter life duration of the module, it is preferable to provide heat radiating means so as to prevent the temperature from excessively increasing over a predetermined value in the shape memory alloy spring 42.

What is claimed is:

1. A light converging solar module, comprising:
   a light converging lens fixedly mounted, for converging sunlight at a focal point;
   a solar cell movably situated according to the position of a converged light spot formed at or close to the focal point of the converging lens;
   position detection means for detecting the position of the converged light spot;
   cell moving means using magnetic force for moving the solar cell to the position of the converged light spot; said converged light spot position being detected by the position detection means, said cell moving means including
   a pedestal;
   a cell holder situated on the pedestal and provided with the solar cell;
   a permanent magnet situated around the pedestal, and surrounding the solar cell; and
   an electromagnet mounted on the cell holder with one end facing the permanent magnet; and the solar cell including:
     a power generation solar cell; and
     at least three movement solar cells,
     the at least three movement solar cells being situated around the power generation solar cell with a substantially equal space between adjoining cells, and connected to the electromagnet, the one end of the electromagnet facing the permanent magnet and the facing portion of the permanent magnet having opposite polarities.

2. A light converging solar module, comprising:
   a light converging lens fixedly mounted, for converging sunlight at a focal point;
   a solar cell movably situated according to the position of a converged light spot formed at or close to the focal point of the converging lens;
   position detection means for detecting the position of the converged light spot;
   cell moving means using magnetic force for moving the solar cell to the position of the converged light spot; said converged light spot position being detected by the position detection means, said cell moving means including
   a pedestal;
   a cell holder situated on the pedestal and provided with the solar cell;
   a permanent magnet situated around the pedestal, and surrounding the solar cell; and
   an electromagnet mounted on the cell holder with one end facing the permanent magnet;
   one end of the electromagnet facing the permanent magnet and having a polarity opposite that of the facing portion of the permanent magnet, the solar cell being divided into a minimum of three sub-cells, the electromagnet being supplied with electric current while being controlled according to the output from the sub-cells.

3. A light converging solar module, comprising:

a light converging lens fixedly mounted, for converging sunlight at a focal point;

a solar cell movably situated according to the position of a converged light spot formed at or close to the focal point of the converging lens;

position detection means for detecting the position of the converged light spot;

said solar cell and the position detection means being mounted on a movable pedestal, said pedestal driving means comprised of a shape memory alloy member for moving the pedestal such that the converged light spot is formed at a central portion of the position detection means.

4. A solar module according to claim 3, wherein the position detection means has a central portion where light is not absorbed, said central portion being surrounded by a plurality of heat collecting members fixed to the pedestal, the heat collecting members being held by the shape memory alloy member fixed to a stationary member.

5. A solar module according to claim 4, wherein the heat collecting members are heat insulated from each other.

6. A solar module according to claim 4, wherein the shape memory alloy memory has a spring configuration.

7. A light converging solar module, comprising:

a light converging lens, fixedly mounted, for converging sunlight at a focal point;

a solar cell movably situated according to the position of a converged light spot formed at or close to the focal point of the converging lens;

position detection means for detecting the position of the converged light spot;

cell moving means using magnetic force for moving the solar cell to the position of the converged light spot, said converged light spot position being detected by the position detection means;

the cell moving means including a pedestal;

a cell holder situated on the pedestal and provided with the solar cell;

a permanent magnet situated around the pedestal, surrounding the solar cell; and an electromagnet mounted on the cell holder, with one end facing the permanent magnet; and the solar cell including:

a power generation solar cell; and at least three movement solar cells, the movement solar cells being situated around the generating solar cell with a substantially equal space between adjoining cells, and connected to the electromagnet, the one end of the electromagnet facing the permanent magnet and the facing portion of the permanent magnet having opposite polarities to each other, and wherein the position detection means is a solar cell.

8. A light converging solar module, comprising:

a light converging lens, fixedly mounted, for converging sunlight at a focal point;

a solar cell movably situated according to the position of a converged light spot formed at or close to the focal point of the converging lens;

position detection means for detecting the position of the converged light spot;

cell moving means using magnetic force for moving the solar cell to the position of the converged light spot, said converged light spot position being detected by the position detection means;

the cell moving means including:

a pedestal;

a cell holder situated on the pedestal and provided with the solar cell;

a permanent magnet situated around the pedestal, surrounding the solar cell; and an electromagnet mounted on the cell holder, with one end facing the permanent magnet; and the solar cell including:

a power generation solar cell; and at least three movement solar cells, the movement solar cells being situated around the generating solar cell with a substantially equal space between adjoining cells, and connected to the electromagnet, the one end of the electromagnet facing the permanent magnet and the facing portion of the permanent magnet having opposite polarities to each other, and wherein the position detection means is a solar cell, which includes at least three movement solar cells situated around a generation solar cell, the three movement solar cells generating electricity to be used for driving the cell moving means, and thereby moving the power generation and movement solar cells.

9. A light converging solar module, comprising:

a light converging lens fixedly mounted, for converging sunlight at a focal point;

a solar cell movably situated according to the position of a converged light spot formed at or close to the focal point of the converging lens;

position detection means for detecting the position of the converged light spot;

cell moving means, using magnetic force for moving the solar cell to the position of the converged light spot, said converged light spot position being detected by the position detection means;

the cell moving means including:

a pedestal;

a cell holder situated on the pedestal and provided with the solar cell;

a permanent magnet situated around the pedestal, surrounding the solar cell; and an electromagnet mounted on the cell holder, with one end facing the permanent magnet; and the solar cell including:

a power generation solar cell; and at least three movement solar cells, the movement solar cells being situated around the generating solar cell with a substantially equal space between adjoining cells, and connected to the electromagnet, the one end of the electromagnet facing the permanent magnet and the facing portion of the permanent magnet having opposite polarities to each other, and wherein
the position detection means is a solar cell, and the power generation solar cell is divided into at least three sub-cells.

10. A light converging solar module, comprising:

a light converging lens, fixedly mounted, for converging sunlight at a focal point;

a solar cell movably situated according to the position of a converged light spot formed at or close to the focal point of the converging lens;

position detection means for detecting the position of the converged light spot;

cell moving means using magnetic force for moving the solar cell to the position of the converged light spot, said converged light spot position being detected by the position detection means;

the cell moving means including:
a pedestal;
a cell holder situated on the pedestal and provided with the solar cell;
a permanent magnet situated around the pedestal, surrounding the solar cell; and
an electromagnet mounted on the cell holder, with one end facing the permanent magnet;
the one end of the electromagnet facing the permanent magnet and the facing portion of the permanent magnet having opposite polarities to each other,
the solar cell being divided into a minimum of three sub-cells,
the electromagnet being supplied with electric current while being controlled according to the output from the sub-cells,
and wherein the position detection means is a solar cell.

11. A light converging solar module, comprising:

a light converging lens fixedly mounted, for converging sunlight at a focal point;

a solar cell movably situated according to the position of a converged light spot formed at or close to the focal point of the converging lens;

position detection means for detecting the position of the converged light spot;

cell moving means using magnetic force for moving the solar cell to the position of the converged light spot, said converged light spot position being detected by the position detection means;

the cell moving means including:
a pedestal;
a cell holder situated on the pedestal and provided with the solar cell;
a permanent magnet situated around the pedestal, surrounding the solar cell; and
an electromagnet mounted on the cell holder, with one end facing the permanent magnet;
the one end of the electromagnet facing the permanent magnet and the facing portion of the permanent magnet having opposite polarities to each other,
the solar cell being divided into a minimum of three sub-cells,
the electromagnet being supplied with electric current while being controlled according to the output from the sub-cells,
wherein the position detection means is a solar cell including at least three movement solar cells situated around a power generation solar cell, the three movement solar cells generating electricity to be used for driving the cell moving means, and thereby moving the power generation and movement solar cells.

12. light converging solar module, comprising:

a light converging lens, fixedly mounted, for converging sunlight at a focal point;

a solar cell movably situated according to the position of a converged light spot formed at or close to the focal point of the converging lens;

position detection means for detecting the position of the converged light spot;

cell moving means using magnetic force for moving the solar cell to the position of the converged light spot, said converged light spot position being detected by the position detection means;

the cell moving means including:
a pedestal;
a cell holder situated on the pedestal and provided with the solar cell;
a permanent magnet situated around the pedestal, surrounding the solar cell; and
an electromagnet mounted on the cell holder, with one end facing the permanent magnet;
the one end of the electromagnet facing the permanent magnet and the facing portion of the permanent magnet having opposite polarities to each other,
the solar cell being divided into a minimum of three movement sub-cells and a power generation cell,
the electromagnet being supplied with electric current while being controlled according to the output from the sub-cells,
wherein the position detection means is a solar cell, and the power generation solar cell is divided into at least three sub-cells.

* * * * *

UNITED STATES PATENT AND TRADEMARK OFFICE
CERTIFICATE OF CORRECTION

PATENT NO. : 5,707,458
DATED : January 13, 1998
INVENTOR(S) : Nagashima et al.

It is certified that error appears in the above-indentified patent and that said Letters Patent is hereby corrected as shown below:

On the title page item [54] and Col. 1, line 1,

IN THE TITLE:

Delete "LIGHT".

Signed and Sealed this

Twenty-first Day of July, 1998

Attest:

BRUCE LEHMAN

Attesting Officer

Commissioner of Patents and Trademarks